US011723181B2

(12) United States Patent
Matsushita

(10) Patent No.: US 11,723,181 B2
(45) Date of Patent: Aug. 8, 2023

(54) ELECTROMAGNETIC WAVE ABSORPTION FILM, ELECTROMAGNETIC WAVE ABSORPTION SHEET

(71) Applicant: LINTEC Corporation, Tokyo (JP)

(72) Inventor: Taiga Matsushita, Saitama (JP)

(73) Assignee: LINTEC Corporation, Tokyo (JP)

(*) Notice: Subject to any disclaimer, the term of this patent is extended or adjusted under 35 U.S.C. 154(b) by 192 days.

(21) Appl. No.: 17/434,978

(22) PCT Filed: Feb. 6, 2020

(86) PCT No.: PCT/JP2020/004578
§ 371 (c)(1),
(2) Date: Aug. 30, 2021

(87) PCT Pub. No.: WO2020/179349
PCT Pub. Date: Sep. 10, 2020

(65) Prior Publication Data
US 2022/0142018 A1 May 5, 2022

(30) Foreign Application Priority Data

Mar. 1, 2019 (JP) ................................ 2019-037839
May 20, 2019 (JP) ................................ 2019-094552

(51) Int. Cl.
*H01Q 17/00* (2006.01)
*H05K 9/00* (2006.01)

(52) U.S. Cl.
CPC ............. *H05K 9/00* (2013.01); *H01Q 17/007* (2013.01); *H01Q 17/008* (2013.01)

(58) Field of Classification Search
CPC ..................... H01Q 17/007; H01Q 17/008
See application file for complete search history.

(56) References Cited

U.S. PATENT DOCUMENTS 5,214,432 A    5/1993  Kasevich et al.
5,617,096 A *  4/1997  Takahashi ............ H01Q 17/008
                                                        342/4

(Continued)

FOREIGN PATENT DOCUMENTS

GB      2460288 A      11/2009
JP    2005-317945      11/2005

(Continued)

OTHER PUBLICATIONS

Extended European Search Report dated Oct. 7, 2022 in European Application No. 20765687.7, 9 pages.

(Continued)

*Primary Examiner* — Hung V Ngo
(74) *Attorney, Agent, or Firm* — Nixon & Vanderhye P.C.

(57) ABSTRACT

An aspect of the present invention provides an electromagnetic wave absorption film that is less susceptible to the surrounding environment.

An electromagnetic wave absorption film 10 has: a planar base 20; a first electromagnetic wave absorption pattern 1 formed on the base 20; a second electromagnetic wave absorption pattern 2 formed on the base 20; and a third electromagnetic wave absorption pattern 3 formed on the base 20, wherein when A [GHz] is defined as a frequency at which an absorption amount of an electromagnetic wave absorbed by the first electromagnetic wave absorption pattern 1 exhibits its local maximum value in a range from 20 to 110 GHz, B [GHz] satisfies Expression (1), B [GHz] being the value of a frequency at which an absorption amount of an electromagnetic wave absorbed by the second electromagnetic wave absorption pattern 2 exhibits its local maximum value, and C [GHz] satisfies Expression (2), C [GHz] being the value of a frequency at which an absorption amount of an electromagnetic wave absorbed by the third electromagnetic wave absorption pattern 3 exhibits its local maximum value, (Continued)

$1.037 \times A \leq B \leq 1.30 \times A$  Expression (1)

$0.60 \times A \leq C \leq 0.963 \times A$  Expression (2).

7 Claims, 10 Drawing Sheets

(56) References Cited

U.S. PATENT DOCUMENTS

| | | | |
|---|---|---|---|
| 10,905,038 B1* | 1/2021 | Centola | H05K 9/0043 |
| 2010/0156695 A1* | 6/2010 | Sim | H01Q 17/008 |
| | | | 342/1 |
| 2013/0285846 A1* | 10/2013 | Kagawa | H05K 9/0086 |
| | | | 342/1 |
| 2014/0111365 A1 | 4/2014 | Liu et al. | |
| 2014/0240159 A1 | 8/2014 | Lawrence et al. | |
| 2015/0138009 A1* | 5/2015 | Liu | H01Q 17/008 |
| | | | 342/1 |
| 2015/0303583 A1* | 10/2015 | Takahashi | H01Q 17/00 |
| | | | 342/1 |
| 2018/0006381 A1* | 1/2018 | Hong | B32B 5/024 |
| 2020/0083596 A1* | 3/2020 | Franco Garcia | H04B 1/3838 |
| 2021/0151897 A1* | 5/2021 | Liu | H01Q 17/008 |

FOREIGN PATENT DOCUMENTS

| | | |
|---|---|---|
| JP | 2009-170887 | 7/2009 |
| JP | 5162424 | 3/2013 |

OTHER PUBLICATIONS

Alireza Kazemzadeh et al: "Multilayered Wideband Absorbers for Oblique Angle of Incidence", IEEE Transactions On Antennas and Propagation, IEEE, USA, vol. 58, No. 11, Aug. 30, 2010 (Aug. 30, 2010), pp. 3637-3646 (10 total pages), XP011317352, ISSN: 0018-926X.

Nilotpal et al.: "An Ultrathin Wide Angle Polarization Insensitive Mid-Infrared Metamaterial Absorber for THz Detection", 2018 IEEE MTT-S International Microwave and RF Conference (IMARC), IEEE, Nov. 28, 2018 (Nov. 28, 2018 ), p. 1, XP033635985, DOI: 10.1109/IMARC.2018.8877169, (4 total pages).

International Search Report for PCT/JP2020/004578 dated Apr. 14, 2020, 5 pages.

Written Opinion of the ISA for PCT/JP2020/004578 dated Apr. 14, 2020, 4 pages.

* cited by examiner

ELECTROMAGNETIC WAVE ABSORPTION FILM, ELECTROMAGNETIC WAVE ABSORPTION SHEET

TECHNICAL FIELD

The present invention relates to an electromagnetic wave absorption film and an electromagnetic wave absorption sheet.

This application is the U.S. national phase of International Application No. PCT/JP2020/004578 filed Feb. 6, 2020 which designated the U.S. and claims priority to JP 2019-037839 filed in Japan on Mar. 1, 2019 and JP 2019-094552 filed in Japan on May 20, 2019, the contents of which are incorporated herein.

BACKGROUND ART

Electromagnetic wave absorption films that selectively absorb electromagnetic waves of a predetermined frequency are known (for example, Patent Document 1). Patent Document 1 describes an electromagnetic wave absorber including a first frequency-selective shielding layer and a second frequency-selective shielding layer. A fine line pattern of a Frequency Selective Surface (FSS) element formed on the first and second frequency-selective shielding layers of the electromagnetic wave absorber described in Patent Document 1 allows each layer to absorb electromagnetic waves of a predetermined frequency, and the electromagnetic wave absorber as a whole selectively shields electromagnetic waves of two different frequencies.

CITATION LIST

Patent Literature

Patent Document 1: JP 5162424 B

SUMMARY OF INVENTION

Technical Problem

However, the electromagnetic wave absorber described in Patent Document 1 is susceptible to both the permittivity of a material placed in the surrounding environment of the electromagnetic wave absorber and the temperature of the surrounding environment. For example, the effect of the permittivity of a material placed in the surrounding environment may cause wavelength reduction phenomenon and deviation of absorption frequency of the electromagnetic wave absorber.

Each of the first and second frequency-selective shielding layers of the electromagnetic wave absorber described in Patent Document 1 selectively absorbs an electromagnetic wave of a predetermined frequency. Therefore, when the frequency of an electromagnetic wave to be absorbed, affected by a material in the surrounding environment, deviates from the predetermined frequency, the electromagnetic wave absorber described in Patent Document 1 may not be able to sufficiently absorb an electromagnetic wave of the predetermined frequency designed to be absorbed.

An object of an aspect of the present invention is to provide an electromagnetic wave absorption film that is less susceptible to the surrounding environment.

Solution to Problem

The present invention has the following aspects.

[1] An electromagnetic wave absorption film having: a planar base; a first electromagnetic wave absorption pattern formed on the base; a second electromagnetic wave absorption pattern formed on the base; and a third electromagnetic wave absorption pattern formed on the base, wherein when A [GHz] is defined as a frequency at which an absorption amount of an electromagnetic wave absorbed by the first electromagnetic wave absorption pattern has its local maximum value in a range from 20 to 110 [GHz], B [GHz] satisfies Expression (1), B [GHz] being a frequency at which an absorption amount of an electromagnetic wave absorbed by the second electromagnetic wave absorption pattern has its local maximum value, and C [GHz] satisfies Expression (2), C [GHz] being a frequency at which an absorption amount of an electromagnetic wave absorbed by the third electromagnetic wave absorption pattern has its local maximum value, $$1.037 \times A \leq B \leq 1.30 \times A \quad \text{Expression (1)}$$

$$0.60 \times A \leq C \leq 0.963 \times A \quad \text{Expression (2)}$$

[2] The electromagnetic wave absorption film according to [1], wherein A is from 50 to 110 [GHz].

[3] The electromagnetic wave absorption film according to [1], wherein A is from 60 to 100 [GHz].

[4] The electromagnetic wave absorption film according to any one of [1] to [3], wherein the first electromagnetic wave absorption pattern has a plurality of first arrangements, in which a plurality of first units whose shapes are a figure identical to each other are arranged, the second electromagnetic wave absorption pattern has a plurality of second arrangements, in which a plurality of second units whose shapes are a figure identical to each other are arranged, the third electromagnetic wave absorption pattern has a plurality of third arrangements, in which a plurality of third units whose shapes are a figure identical to each other are arranged, and the first arrangement, the second arrangement, as well as the third arrangement are disposed on the base in a manner that the first arrangement, the second arrangement, and the third arrangement are adjacent to each other.

[5] An electromagnetic wave absorption sheet having the electromagnetic wave absorption film according to any one of [1] to [4] and a spacer film provided on a surface on one side of the electromagnetic wave absorption film.

[6] The electromagnetic wave absorption sheet according to [5], wherein the spacer film is a foam sheet.

[7] The electromagnetic wave absorption sheet according to [5] or [6], further having a reflective film provided at a surface of the spacer film.

Advantageous Effects of Invention

An aspect of the present invention provides an electromagnetic wave absorption film that is less susceptible to the surrounding environment.

DESCRIPTION OF EMBODIMENTS

In the present specification, an "electromagnetic wave absorption pattern" refers to an object that is a collection of units that are geometric figures and that selectively absorbs electromagnetic waves of a certain frequency. It may be construed that the "electromagnetic wave absorption pattern" has the same function as that of an antenna.

In the present specification, "electromagnetic waves in the millimeter wave region" refers to electromagnetic waves having a wavelength from 1 to 15 [mm]. "Electromagnetic waves in the millimeter wave region" also refers to electromagnetic waves having a frequency from 20 to 300 [GHz].

In the present specification, "from (a number) to (a number)", which indicates a numerical range, includes the number after "from" as the lower limit of the numerical range and the number after "to" as the upper limit of the numerical range.

(Electromagnetic Wave Absorption Film)

An embodiment example in which the present invention is applied will be described below. In order to facilitate understanding of the features of the present invention, the drawings used in the following description may, for convenience, illustrate an enlarged portion of a main part; the dimension ratio and the like of each component illustrated may not necessarily be the same value as the actual dimension ratio and the like.

Figure 1:
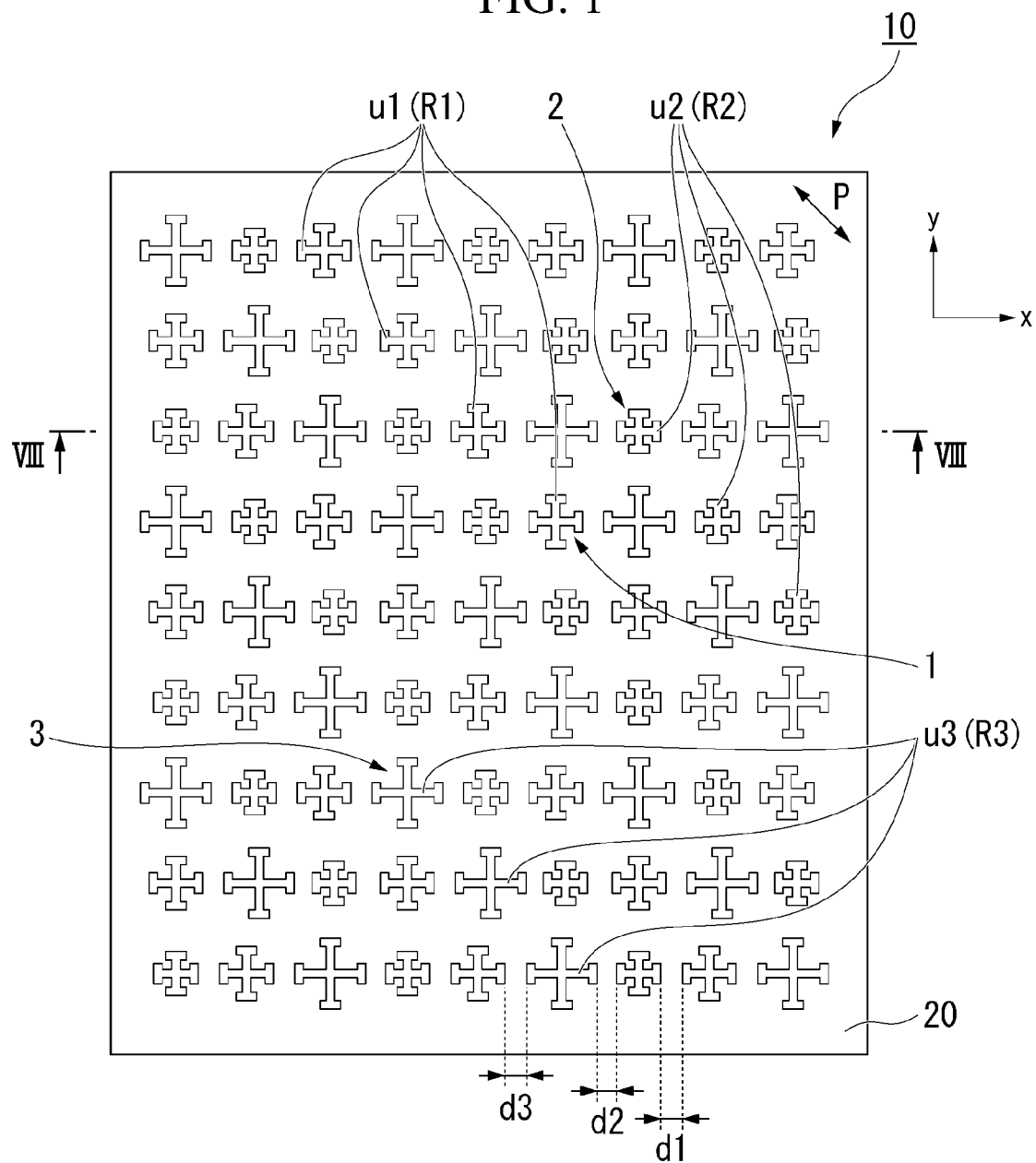
FIG. 1 is a top view illustrating an example of an electromagnetic wave absorption film of the present invention.

FIG. 1 is a top view illustrating an example of an electromagnetic wave absorption film of the present invention. As illustrated in FIG. 1, an electromagnetic wave absorption film 10 has: a planar base 20; a first electromagnetic wave absorption pattern 1 formed on the base 20; a second electromagnetic wave absorption pattern 2 formed on the base 20; and a third electromagnetic wave absorption pattern 3 formed on the base 20. The first electromagnetic wave absorption pattern 1, the second electromagnetic wave absorption pattern 2, and the third electromagnetic wave absorption pattern 3 are formed on a surface of the base 20.

(First Electromagnetic Wave Absorption Pattern)

Figure 2:
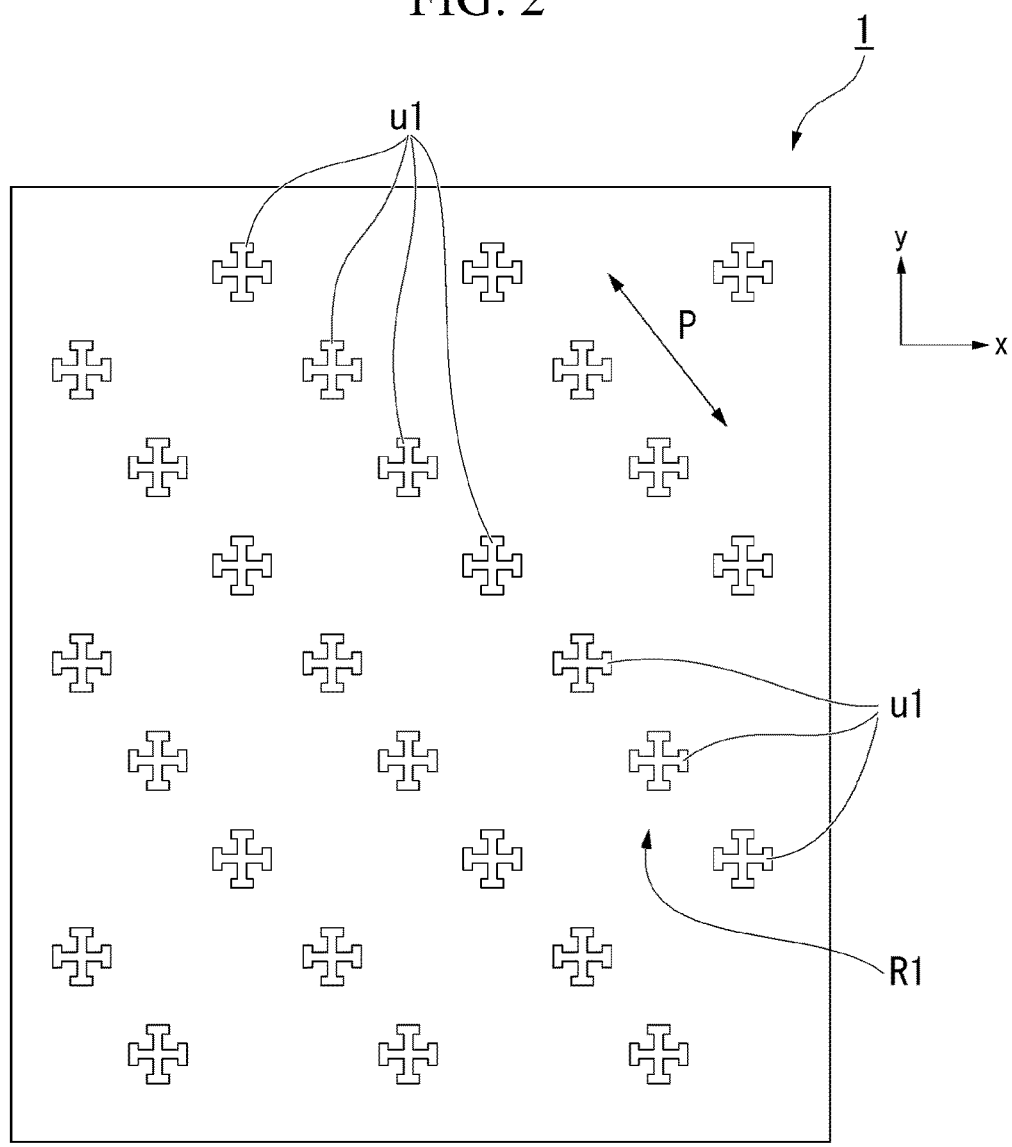
FIG. 2 is a top view illustrating a first electromagnetic wave absorption pattern of the electromagnetic wave absorption film in FIG. 1.

FIG. 2 is a top view illustrating the first electromagnetic wave absorption pattern 1.

As illustrated in FIG. 2, the first electromagnetic wave absorption pattern 1 is composed of a plurality of first units u1. Each of the first units u1 is a geometric figure. That is, it may be construed that the first electromagnetic wave absorption pattern 1 is a collection of first units u1 that are geometric figures.

Each of the first units u1 functions as single antenna. The first electromagnetic wave absorption pattern 1 may be, for example, a fine line pattern of an FSS element.

In the first electromagnetic wave absorption pattern 1, a plurality of first arrangements R1, in which a plurality of first units u1 are arranged along a direction indicated by a double-headed arrow P in FIG. 2, are formed. It may be construed that the first electromagnetic wave absorption pattern 1 has a plurality of first arrangements R1. The first electromagnetic wave absorption pattern 1 can be constituted by formation of, on the base 20, a plurality of first arrangements R1 along a direction indicated by the double-headed arrow P at predetermined spacings.

The spacings between the plurality of first arrangements R1 are not particularly limited. The spacings between the first arrangements R1 may be regular or irregular.

Figure 3:
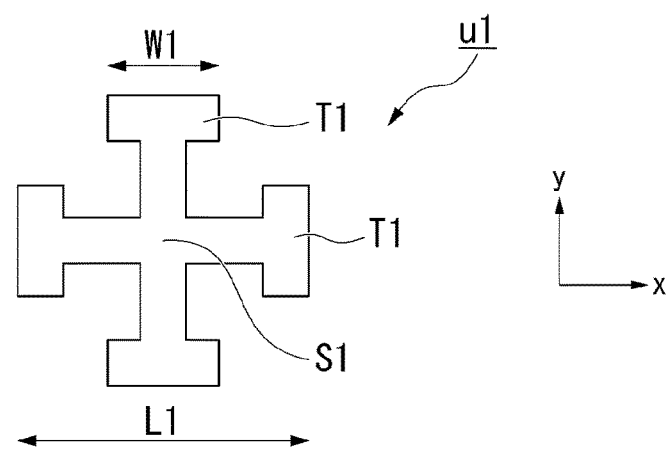
FIG. 3 is a top view illustrating a first unit constituting the first electromagnetic wave absorption pattern in FIG. 2.

FIG. 3 is a top view illustrating a first unit u1.

FIG. 3 is a top view illustrating a first unit u1 that constitutes the first electromagnetic wave absorption pattern 1.

As illustrated in FIG. 3, a shape of the first unit u1 is a cross shape with vertical and horizontal symmetry. Specifically, the first unit u1 has one cross portion S1 and four end portions T1. The cross portion S1 is composed of a linear portion parallel to the x-axis direction in FIG. 3 and a linear portion parallel to the y-axis direction in FIG. 3. The end portions T1 having a linear shape are each in contact with and perpendicular to each of both ends of the linear portion parallel to the x-axis direction or in contact with and perpendicular to each of both ends of the linear portion parallel to the y-axis direction.

By adjusting each of a length L1 of the first unit u1 along the x-axis direction and a length W1 of each of the four end portions T1 along the x-axis direction, an electromagnetic wave absorption characteristic resulting from the first unit u1 that functions as single antenna can be adjusted. The electromagnetic wave absorption characteristic can also be adjusted by adjustments in the y-axis direction in the same manner.

It should be noted that the shape of the first unit is not limited to a cross shape. The shape of the first unit is not particularly limited provided that it is an aspect in which the value of a frequency is to be A [GHz], where an absorption amount of an electromagnetic wave absorbed by the first electromagnetic wave absorption pattern exhibits its local maximum value at the frequency. Examples of the shape of a figure for the first unit include a circular shape, an annular shape, a linear shape, a rectangular shape, a polygonal shape, an H shape, a Y shape, and a V shape.

In the electromagnetic wave absorption film 10, the shapes of the plurality of first units u1 are identical to each other. It should be noted that the shapes of the plurality of first units u1 do not need to be identical to each other. In other examples of the present invention, the shapes of the plurality of first units may be identical to or different from each other, as long as the shapes are within a range in which the effects of the present invention can be achieved.

The first electromagnetic wave absorption pattern 1 selectively absorbs an electromagnetic wave of a frequency of A [GHz]. The value of the frequency A [GHz] is a value of a frequency at which an absorption amount of an electromagnetic wave absorbed by the first electromagnetic wave absorption pattern 1 exhibits its local maximum value in a range from 20 to 110 GHz.

The value of the frequency A [GHz] at which an absorption amount of an electromagnetic wave absorbed by the first electromagnetic wave absorption pattern 1 exhibits its local maximum value can be determined by, for example, Method X or Method Y below.

Method X: A standard film, which will be described below, is irradiated with an electromagnetic wave while the frequency is swept within a range from 20 to 110 [GHz], and the frequency of the electromagnetic wave, at which an absorption amount of the electromagnetic wave absorbed by the standard film exhibits its maximum value, is designated as A [GHz].

Method Y: From an electromagnetic wave absorption film having a base and a plurality of electromagnetic wave absorption patterns formed on the base, the electromagnetic wave absorption pattern is removed from the base so that only one electromagnetic wave absorption pattern remains on the base. Next, the film having only one electromagnetic wave absorption pattern is irradiated with an electromagnetic wave while the frequency is swept within a range from 20 to 110 [GHz], and the frequency of the electromagnetic wave, at which an absorption amount of the electromagnetic wave absorbed by the film exhibits its maximum value, is designated as A [GHz].

The standard film has a planar standard base and a standard pattern formed at the standard base.

Details of the standard base can be the same as those of the base 20. Therefore, details of the standard base will be described in the description of the base 20 below.

The standard pattern consists of only a plurality of standard units whose shapes are the figure identical to each other. It may be construed that the standard pattern, formed on the standard base of the standard film, consists of only one type of the figure having the identical shape. The standard pattern can be formed of a fine line pattern of an ordinary FSS element. Typically, the standard pattern is an electromagnetic wave absorption pattern identical to that of the first electromagnetic wave absorption pattern 1.

For the standard pattern, the shapes of the plurality of standard units are not particularly limited provided that they are the figure identical to each other. Examples of the shape of the figure for the standard unit include a circular shape, an annular shape, a linear shape, a rectangular shape, a polygonal shape, a cross shape, an H shape, a Y shape, and a V shape. Typically, the shape of the standard unit is identical to that of the first unit u1.

The standard film has a plurality of standard units arranged on the standard base in a manner that the spacings between the ends of the figures are 1 [mm]. For example, when the figure of the standard unit is a cross shape, the intersection of the cross is the center of the figure, and the ends of the figure are the portions furthest away from the center along each of the directions of the two linear portions constituting the cross.

A material of the standard unit constituting the standard pattern is not particularly limited, provided that it is an aspect in which the material allows an absorption amount of an electromagnetic wave absorbed by the standard film to exhibit its maximum value when the standard film is irradiated with the electromagnetic wave while the frequency is swept within a range from 20 to 110 [GHz].

Details of the material of the standard unit can be identical to those of the first unit.

The absorption amount of an electromagnetic wave absorbed by the standard film can be calculated using Equation (3) below.

Absorption Amount=Input Signal−Reflection Characteristic ($S11$)−Transmission Characteristic ($S21$)     Equation (3)

"Input signal" is an indicator of an intensity of an electromagnetic wave at an irradiation source when a standard film is irradiated with the electromagnetic wave.

"Reflection characteristic ($S11$)" is an indicator of an intensity of an electromagnetic wave reflected by a standard film when the standard film is irradiated with the electromagnetic wave by an irradiation source. Reflection characteristic ($S11$) can be measured, for example, by a free space method using a vector network analyzer.

"Transmission characteristic ($S21$)" is an indicator of an intensity of an electromagnetic wave that passes through a standard film when the standard film is irradiated with the electromagnetic wave by an irradiation source. Transmission characteristic ($S21$) can be measured, for example, by a free space method using a vector network analyzer.

The frequency A [GHz] can be determined, for example, by the following method.

First, an electromagnetic wave is irradiated on a standard film while the frequency is swept within a range from 20 to 110 [GHz], and the absorption amount of the electromagnetic wave absorbed by the standard film is calculated using Equation (3) above.

Thereafter, the frequency that has been swept is plotted on the horizontal axis, while the absorption amount calculated using Equation (3) above is plotted on the vertical axis, hence creating an absorption spectrum chart. Typically, in this absorption spectrum chart, there is one value of the frequency on the horizontal axis at which the absorption amount is the maximum value. Thus, a single peak at which the absorption amount of the electromagnetic wave reaches its local maximum value is observed on the plot diagram. In this way, the frequency of the electromagnetic wave, at which the absorption amount of the electromagnetic wave exhibits its maximum value, can be designated as A [GHz].

When using Method X, in a case where the value of the frequency A can be predicted in advance, the frequency of the electromagnetic wave irradiating the standard film may be swept within a range narrower than from 20 to 110 [GHz]. For example, the frequency of the electromagnetic wave irradiating the standard film may be swept within a range from 50 to 110 [GHz].

The first electromagnetic wave absorption pattern 1 absorbs electromagnetic waves having a frequency of A [GHz] as determined by Method X above.

For the electromagnetic wave absorption film according to an embodiment of the present invention, the value of the frequency A is preferably from 50 to 110 [GHz], more preferably from 60 to 100 [GHz], even more preferably from 65 to 95 [GHz], and particularly preferably from 70 to 90 [GHz]. When the value of the frequency A is within such a numerical range, the electromagnetic wave absorption film can absorb electromagnetic waves in the millimeter wave region, and thus the electromagnetic wave absorption film according to an embodiment of the present invention can be readily applied to automobile components, road-periphery members, construction outer wall-related materials, windows, communication devices, and radio telescopes.

The absorption amount of an electromagnetic wave by a film can be measured using Method Y in the same manner as Method X. In other words, a film is irradiated with an electromagnetic wave while the frequency is swept within a range from 20 to 110 [GHz], and the absorption amount of the electromagnetic wave absorbed by the film is calculated using Equation (3) above.

Thereafter, the frequency is plotted on the horizontal axis, while the absorption amount calculated using Equation (3) above is plotted on the vertical axis, hence creating an absorption spectrum chart. Typically, in this absorption spectrum chart, there is one value of the frequency on the horizontal axis at which the absorption amount reaches its maximum value. Thus, a single peak at which the absorption amount of the electromagnetic wave reaches its local maximum value is observed on the plot diagram. In this way, the frequency of the electromagnetic wave, at which the absorption amount of the electromagnetic wave exhibits its maximum value, can be designated as A [GHz].

A material of the first unit u1 is not particularly limited as long as it is within a range in which the effects of the present invention can be achieved.

Examples of the material of the first unit include a fine metal wire, a thin conductive film, and a fixed product of a conductive paste.

Examples of the metal include copper, aluminum, tungsten, iron, molybdenum, nickel, titanium, silver, gold, and an alloy containing two or more of the metals listed above (for example, steel such as stainless steel and carbon steel, brass, phosphor bronze, zirconium-copper alloy, beryllium-copper, iron-nickel, nichrome, nickel-titanium, kanthal, hastelloy, and rhenium-tungsten).

Examples of a material of the thin conductive film include metal particles, carbon nanoparticles, and carbon fibers.

Spacings between the ends of the figures that are the first units u1 are not particularly limited as long as the spacings are within a range in which the effects of the present invention can be achieved.

For example, the spacing between the ends of the figures that are the first units u1 may all be identical or may be different from each other. However, from the viewpoint that an electromagnetic wave absorption film that is less susceptible to the surrounding environment can be easily designed and, during production, precision of the frequency band of electromagnetic waves to be absorbed can be improved, the spacings between the ends of the figures that are the first units u1 are preferably identical to each other.

Second Electromagnetic Wave Absorption Pattern

Figure 4:
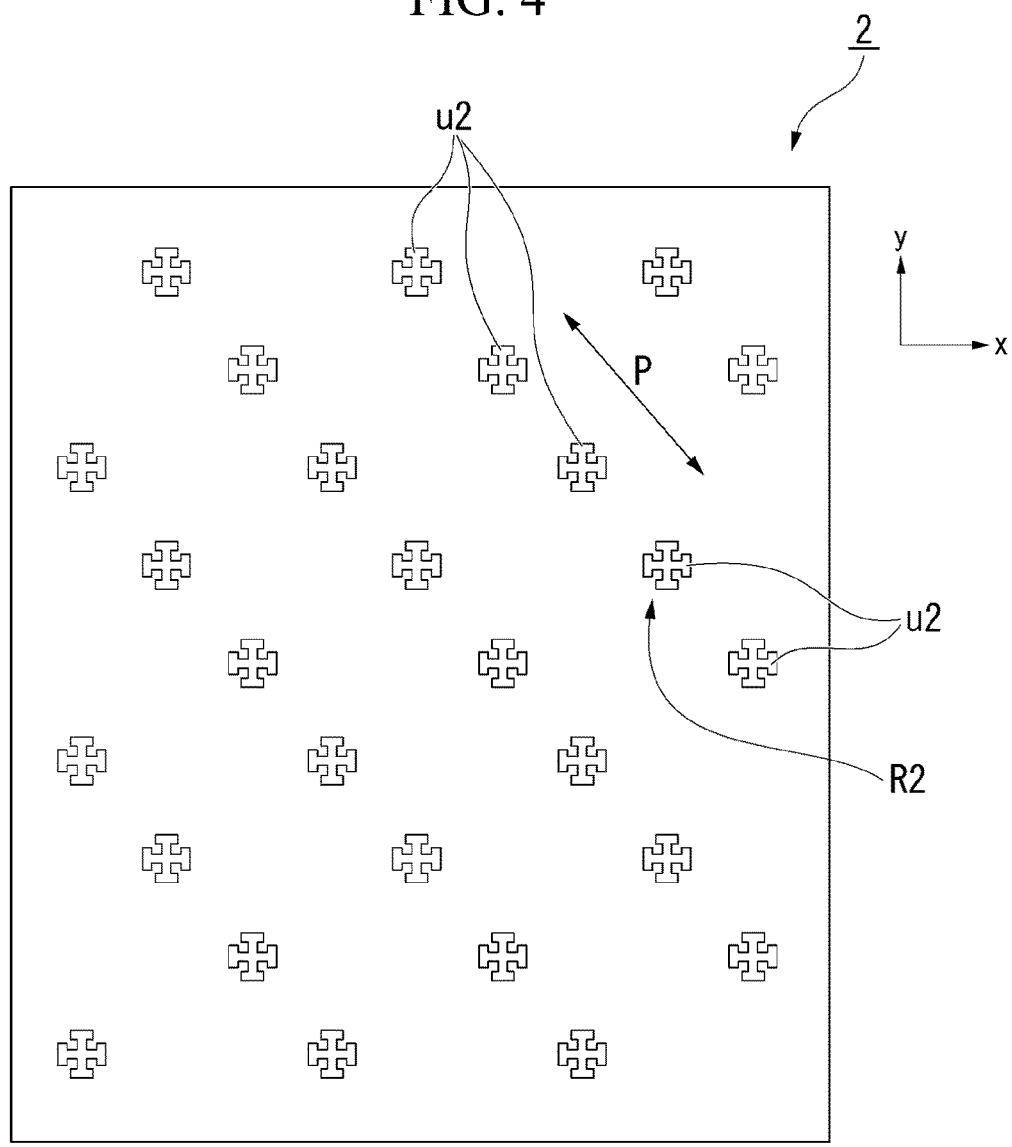
FIG. 4 is a top view illustrating a second electromagnetic wave absorption pattern of the electromagnetic wave absorption film in FIG. 1.

FIG. 4 is a top view illustrating the second electromagnetic wave absorption pattern 2.

As illustrated in FIG. 4, the second electromagnetic wave absorption pattern 2 is composed of a plurality of second units u2. Each of the second units u2 is a geometric figure. That is, it may be construed that the second electromagnetic wave absorption pattern 2 is a collection of second units u2 that are geometric figures.

Each of the second units u2 functions as single antenna. The second electromagnetic wave absorption pattern 2 may be, for example, a fine line pattern of an FSS element.

In the second electromagnetic wave absorption pattern 2, a plurality of second arrangement R2, in which a plurality of second units u2 are arranged along a direction indicated by a double-headed arrow P in FIG. 4 is formed. It may be construed that the second electromagnetic wave absorption pattern 2 has a plurality of second arrangements R2. The second electromagnetic wave absorption pattern 2 can be constituted by formation of, on the base 20, the second arrangement R2 along a direction indicated by the double-headed arrow P at predetermined spacings.

The spacings between the plurality of second arrangements R2 are not particularly limited. The spacings between the second arrangements R2 may be regular or irregular.

Figure 5:
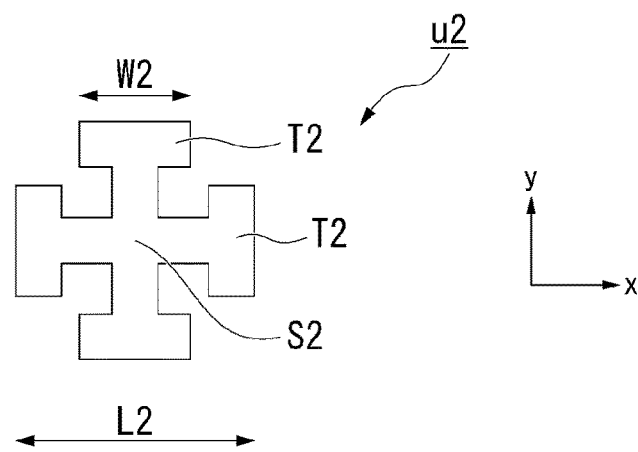
FIG. 5 is a top view illustrating a second unit constituting the second electromagnetic wave absorption pattern in FIG. 4.

FIG. 5 is a top view illustrating a second unit u2.

As illustrated in FIG. 5, a shape of the second unit u2 is a cross shape with vertical and horizontal symmetry. Specifically, the second unit u2 has one cross portion S2 and four end portions T2. The cross portion S2 is composed of a linear portion parallel to the x-axis direction in FIG. 5 and a linear portion parallel to the y-axis direction in FIG. 5. The end portions T2 having a linear shape are each in contact with and perpendicular to each of both ends of the linear portion parallel to the x-axis direction or in contact with and perpendicular to each of both ends of the linear portion parallel to the y-axis direction.

In the electromagnetic wave absorption film 10, a length L2 of the second unit u2 in the x-axis direction is shorter than the length L1 of the first unit u1 in the x-axis direction. In addition, a length W2 of each of the four end portions T2 in the x-axis or y-axis direction is shorter than the length W1 of each of the four end portions T1 of the first unit u1.

By adjusting each of a length L2 of the second unit u2 along the x-axis direction and a length W2 of each of the four end portions T2 along the x-axis direction, an electromagnetic wave absorption characteristic resulting from the second unit u2 that functions as single antenna can be adjusted. The electromagnetic wave absorption characteristic can also be adjusted by adjustments in the y-axis direction in the same manner.

In the electromagnetic wave absorption film 10, the shapes of the plurality of second units u2 are identical to each other. It should be noted that the shapes of the plurality of second units u2 do not need to be a figure identical to each other. In other examples of the present invention, the shapes of the plurality of second units may be identical to or different from each other, as long as the shapes are within a range in which the effects of the present invention can be achieved.

The second electromagnetic wave absorption pattern 2 selectively absorbs an electromagnetic wave of a frequency of B [GHz], B satisfying Expression (1) below. The value of the frequency B [GHz] is a value of a frequency at which an absorption amount of an electromagnetic wave absorbed by the second electromagnetic wave absorption pattern 2 exhibits its local maximum value. The value of frequency B [GHz] satisfies Expression (1) below.

$$1.037 \times A \leq B \leq 1.30 \times A \qquad \text{Expression (1)}$$

As presented in Expression (1), the second electromagnetic wave absorption pattern 2 absorbs an electromagnetic wave of a frequency from 1.037×A to 1.30×A [GHz]. The second electromagnetic wave absorption pattern 2 preferably absorbs an electromagnetic wave of a frequency from 1.17×A to 1.30×A [GHz].

Because the second electromagnetic wave absorption pattern 2 absorbs electromagnetic waves of a frequency of 1.037×A [GHz] or greater, the peak of an absorption amount of an electromagnetic wave absorbed by the second electromagnetic wave absorption pattern 2 and the peak of an absorption amount of an electromagnetic wave absorbed by the first electromagnetic wave absorption pattern 1 sufficiently overlap in a frequency band higher than A [GHz]. As a result, compared to a case where a film has only the first electromagnetic wave absorption pattern 1, the frequency band of electromagnetic waves that can be absorbed by the entire electromagnetic wave absorption film is extended to a frequency band on the higher frequency side of A [GHz].

Because the second electromagnetic wave absorption pattern 2 absorbs electromagnetic waves of a frequency of 1.30×A [GHz] or smaller, a difference in frequency between the peak of an absorption amount of an electromagnetic wave absorbed by the second electromagnetic wave absorption pattern 2 and the peak of an absorption amount of an electromagnetic wave absorbed by the first electromagnetic wave absorption pattern 1 in a frequency band higher than A [GHz] is reduced. As a result, a single peak at which an absorption amount of electromagnetic waves absorbed by the entire electromagnetic wave absorption film reaches its local maximum value is observed.

As such, the second electromagnetic wave absorption pattern 2 absorbs electromagnetic waves of a frequency from 1.037×A to 1.30×A [GHz], and thus the absorption amount of electromagnetic waves absorbed by the entire electromagnetic wave absorption film is extended to a frequency band on the higher frequency side.

It should be noted that the shape of the second unit is not limited to a cross shape. The shape of the second unit is not particularly limited as long as it is within a range in which the effects of the present invention can be achieved. Examples of the shape of a figure for the second unit include a circular shape, an annular shape, a linear shape, a rectangular shape, a polygonal shape, an H shape, a Y shape, and a V shape.

A material of the second unit constituting the second electromagnetic wave absorption pattern 2 is not particularly limited, provided that it is an aspect in which the material can absorb electromagnetic waves of B [GHz] and the material is within a range in which the effects of the present invention can be achieved.

Description of the material of the second unit is the same as that of the material of the first unit u1.

Spacings between the ends of the figures that are the second units u2 are not particularly limited as long as the spacings are within a range in which the effects of the present invention can be achieved.

For example, the spacings between the ends of the figures that are the second units u2 may all be identical or may be different from each other. However, from the viewpoint that an electromagnetic wave absorption film that is less susceptible to the surrounding environment can be easily designed and, during production, precision of the frequency band of electromagnetic waves to be absorbed can be improved, the spacings between the ends of the figures that are the second units u2 are preferably identical to as each other.

(Third Electromagnetic Wave Absorption Pattern)

Figure 6:
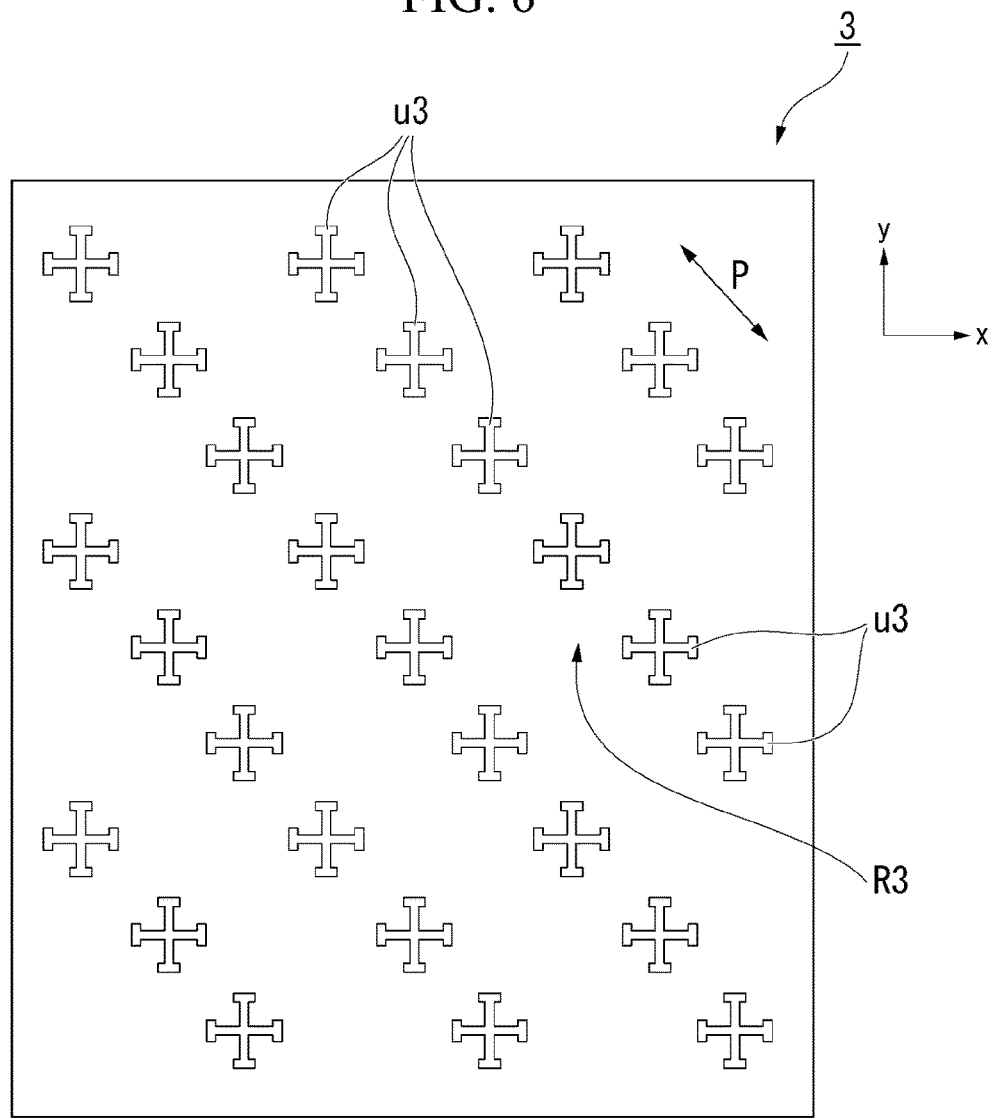
FIG. 6 is a top view illustrating a third electromagnetic wave absorption pattern of the electromagnetic wave absorption film in FIG. 1.

FIG. 6 is a top view illustrating the third electromagnetic wave absorption pattern 3.

As illustrated in FIG. 6, the third electromagnetic wave absorption pattern 3 is composed of a plurality of third units u3. Each of the third units u3 is a geometric figure. That is, it may be construed that the third electromagnetic wave absorption pattern 3 is a collection of third units u3 that are geometric figures.

Each of the third units u3 functions as single antenna. The third electromagnetic wave absorption pattern 3 may be, for example, a fine line pattern of an FSS element.

In the third electromagnetic wave absorption pattern 3, a plurality of third arrangement R3, in which a plurality of third units u3 are arranged along a direction indicated by a double-headed arrow P in FIG. 6 is formed. It may be construed that the third electromagnetic wave absorption pattern 3 has a plurality of third arrangements R3. The third electromagnetic wave absorption pattern 3 can be constituted by formation of, on the base 20, the third arrangement R3 along a direction indicated by the double-headed arrow P at predetermined spacings.

The spacings between the plurality of third arrangements R3 are not particularly limited. The spacings between the third arrangements R3 may be regular or irregular.

Figure 7:
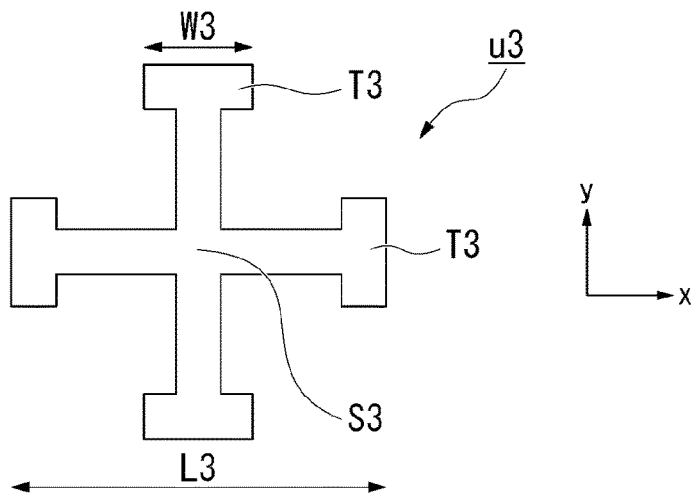
FIG. 7 is a top view illustrating a third unit constituting the third electromagnetic wave absorption pattern in FIG. 6.

FIG. 7 is a top view illustrating a third unit u3.

As illustrated in FIG. 7, a shape of the third unit u3 is a cross shape with vertical and horizontal symmetry. Specifically, the third unit u3 has one cross portion S3 and four end portions T3. The cross portion S3 is composed of a linear portion parallel to the x-axis direction in FIG. 7 and a linear portion parallel to the y-axis direction in FIG. 7. The end portions T3 having a linear shape are each in contact with and perpendicular to each of both ends of the linear portion parallel to the x-axis direction or in contact with and perpendicular to each of both ends of the linear portion parallel to the y-axis direction.

In the electromagnetic wave absorption film 10, a length L3 of the third unit u3 in the x-axis direction is longer than the length L1 of the first unit u1 in the x-axis direction. In addition, a length W3 of each of the four end portions T3 in the x-axis or y-axis direction is longer than the length W1 of each of the four end portions T1 of the first unit u1.

By adjusting each of a length L3 of the third unit u3 along the x-axis direction and a length W3 of each of the four end portions T3 along the x-axis direction, an electromagnetic wave absorption characteristic resulting from the third unit u3 that functions as single antenna can be adjusted. The electromagnetic wave absorption characteristic can also be adjusted by adjustments in the y-axis direction in the same manner.

In the electromagnetic wave absorption film 10, the shapes of the plurality of third units u3 are identical to each other. It should be noted that the shapes of the plurality of third units u3 do not need to be a figure identical to each other. In other examples of the present invention, the shapes of the plurality of third units may be identical to or different from each other, as long as the shapes are within a range in which the effects of the present invention can be achieved.

The third electromagnetic wave absorption pattern 3 selectively absorbs electromagnetic waves of a frequency of C [GHz], C satisfying Expression (2) below. The value of the frequency C [GHz] is a value of a frequency at which an absorption amount of an electromagnetic wave absorbed by the third electromagnetic wave absorption pattern 3 exhibits its local maximum value. The value of the frequency C [GHz] satisfies Expression (2) below.

$$0.60 \times A \leq C \leq 0.963 \times A \quad \text{Expression (2)}$$

As presented in Expression (2), the third electromagnetic wave absorption pattern 3 absorbs electromagnetic waves of a frequency from 0.60×A to 0.963×A [GHz]. The third electromagnetic wave absorption pattern 3 preferably absorbs an electromagnetic wave of a frequency from 0.60×A to 0.83×A [GHz].

Because the third electromagnetic wave absorption pattern 3 absorbs electromagnetic waves of a frequency of 0.60×A [GHz] or greater, a difference in frequency between the peak of an absorption amount of an electromagnetic wave absorbed by the third electromagnetic wave absorption pattern 3 and the peak of an absorption amount of an electromagnetic wave absorbed by the first electromagnetic wave absorption pattern 1 in a frequency band lower than A [GHz] is reduced. As a result, a single peak at which an absorption amount of electromagnetic waves absorbed by the entire electromagnetic wave absorption film reaches its local maximum value is observed.

Because the third electromagnetic wave absorption pattern 3 absorbs electromagnetic waves of a frequency of 0.963×A [GHz] or smaller, the peak of an absorption amount of an electromagnetic wave absorbed by the third electromagnetic wave absorption pattern 3 and the peak of an absorption amount of an electromagnetic wave absorbed by the first electromagnetic wave absorption pattern 1 sufficiently overlap in a frequency band lower than A [GHz]. As a result, compared to a case where a film has only the first electromagnetic wave absorption pattern 1, the frequency band of electromagnetic waves that can be absorbed by the entire electromagnetic wave absorption film is extended to a frequency band on the lower frequency side of A [GHz].

As such, the third electromagnetic wave absorption pattern 3 absorbs electromagnetic waves of a frequency from 0.60×A to 0.963×A [GHz], and thus the absorption amount of electromagnetic waves absorbed by the entire electromagnetic wave absorption film is extended to a frequency band on the lower frequency side.

It should be noted that the shape of the third unit u3 is not limited to a cross shape. The shape of the third unit u3 is not particularly limited as long as the shape is within a range in which the effects of the present invention can be achieved. Examples of the shape of a figure for the third unit include a circular shape, an annular shape, a linear shape, a rectangular shape, a polygonal shape, an H shape, a Y shape, and a V shape.

A material of the third unit u3 constituting the third electromagnetic wave absorption pattern 3 is not particularly limited, provided that it is an aspect in which the material can absorb electromagnetic waves of C [GHz] and the material is within a range in which the effects of the present invention can be achieved.

Description of the material of the third unit u3 is the same as that of the material of the first unit u1.

Spacings between the ends of the figures that are the third units u3 are not particularly limited as long as the spacings are within a range in which the effects of the present invention can be achieved.

For example, the spacings between the ends of the figures that are the third units u3 may all be identical or may be different from each other. However, from the viewpoint that an electromagnetic wave absorption film that is less susceptible to the surrounding environment can be easily designed and, during production, precision of the frequency band of electromagnetic waves to be absorbed can be improved, the spacings between the ends of the figures that are the third units u3 are preferably identical to each other.

In the electromagnetic wave absorption film 10 illustrated in FIG. 1, the first arrangements R1, the second arrangements R2, and the third arrangements R3 are arranged adjacent to each other along a direction indicated by the double-headed arrow P. As such, the first arrangements R1, the second arrangements R2, and the third arrangements R3 are disposed adjacent to each other on the base 20, and thus the frequency band of an electromagnetic wave selectively absorbed by the second electromagnetic wave absorption pattern and the frequency band of an electromagnetic wave selectively absorbed by the third electromagnetic wave absorption pattern overlap with reference to the value of the frequency A [GHz] of the peak position of an electromagnetic wave selectively absorbed by the first electromagnetic wave absorption pattern 1. As a result, the absorption band of electromagnetic waves absorbed by the entire electromagnetic wave absorption film 10 can be more easily extended to both the higher frequency side and the lower frequency side with reference to the value of the frequency A [GHz] of the peak position.

A spacing d1 between the first unit u1 and the second unit u2, a spacing d2 between the second unit u2 and the third unit u3, a the spacing d3 between the third unit u3 and the first unit u1, each as illustrated in FIG. 1, may be identical to or different from each other.

The spacing d1 may be, for example, from 0.2 to 4 mm, from 0.3 to 2 mm, or from 0.5 to 1 [mm].

The spacing d2 may be, for example, from 0.2 to 4 mm, from 0.3 to 2 mm, or from 0.5 to 1 [mm].

The spacing d3 may be, for example, from 0.2 to 4 mm, from 0.3 to 2 mm, or from 0.5 to 1 [mm].

When the spacing d1, the spacing d2, and the spacing d3 are within the aforementioned numerical ranges, the absorption band of electromagnetic waves absorbed by the entire electromagnetic wave absorption film 10 can be more easily extended with reference to the value of the frequency A [GHz] of the peak position.

A shape of the first unit u1, a shape of the second unit u2, and a shape of the third unit u3 of the electromagnetic wave absorption film 10 are identical to each other. It should be noted that the shapes of the first unit u1, the second unit u2, and the third unit u3 do not need to be the figure identical to each other. That is, in other examples of the present invention, the shapes of the first unit u1, the second unit u2, and the third u3 may be identical to or different from each other.

The electromagnetic wave absorption film 10 may have a plurality of second electromagnetic wave absorption patterns. For example, in addition to the second electromagnetic wave absorption pattern 2, the electromagnetic wave absorption film 10 may further have an electromagnetic wave absorption pattern 2a and an electromagnetic wave absorption pattern 2b as described below.

Electromagnetic wave absorption pattern 2a: An electromagnetic wave absorption pattern with which a value of a frequency at which an absorption amount of an electromagnetic wave absorbed exhibits its local maximum value is D [GHz], D satisfying Expression (4) below.

Electromagnetic wave absorption pattern 2b: An electromagnetic wave absorption pattern with which a value of a frequency at which an absorption amount of an electromagnetic wave absorbed exhibits its local maximum value is E [GHz], E satisfying Expression (5) below.

$$1.037 \times A \leq D < 1.09 \times A \quad \text{Expression (4)}$$

$$1.09 \times A \leq E < 1.17 \times A \quad \text{Expression (5)}$$

In Expression (4) and Expression (5), A is a frequency [GHz] determined by Method X or Method Y described above.

In a case where the electromagnetic wave absorption film 10 further has the electromagnetic wave absorption pattern 2a and the electromagnetic wave absorption pattern 2b in addition to the second electromagnetic wave absorption pattern 2, the value of a frequency at which an absorption amount of an electromagnetic wave absorbed by the second electromagnetic wave absorption pattern 2 exhibits its local maximum value is preferably from 1.17×A to 1.30×A [GHz]. In this case, the effect of extending the frequency band of electromagnetic waves that can be absorbed by the entire electromagnetic wave absorption film to a higher frequency side is more prominent, and the effects of the present invention can be more prominent.

The electromagnetic wave absorption film 10 may have a plurality of third electromagnetic wave absorption patterns. For example, in addition to the third electromagnetic wave absorption pattern 3, the electromagnetic wave absorption film 10 may further have an electromagnetic wave absorption pattern 3a and an electromagnetic wave absorption pattern 3b as described below.

Electromagnetic wave absorption pattern 3a: An electromagnetic wave absorption pattern with which a value of a frequency at which an absorption amount of an electromagnetic wave absorbed exhibits its local maximum value is F [GHz], F satisfying Expression (6) below.

Electromagnetic wave absorption pattern 3b: An electromagnetic wave absorption pattern with which a value of a frequency at which an absorption amount of an electromagnetic wave absorbed exhibits its local maximum value is G [GHz], G satisfying Expression (7) below.

$$0.91 \times A < F \leq 0.963 \times A \quad \text{Expression (6)}$$

$$0.83 \times A < G \leq 0.91 \times A \quad \text{Expression (7)}$$

In Expression (6) and Expression (7), A is a frequency [GHz] determined by Method X or Method Y described above.

In a case where the electromagnetic wave absorption film 10 further has the electromagnetic wave absorption pattern 3a and the electromagnetic wave absorption pattern 3b in addition to the third electromagnetic wave absorption pattern 3, the value of a frequency at which an absorption amount of an electromagnetic wave absorbed by the third electromagnetic wave absorption pattern 3 exhibits its local maximum value is preferably from 0.60×A to 0.83×A [GHz]. In this case, the effect of extending the frequency band of electromagnetic waves that can be absorbed by the entire electromagnetic wave absorption film to a lower frequency side is more prominent, and the effects of the present invention can be more prominent.

Figure 8:
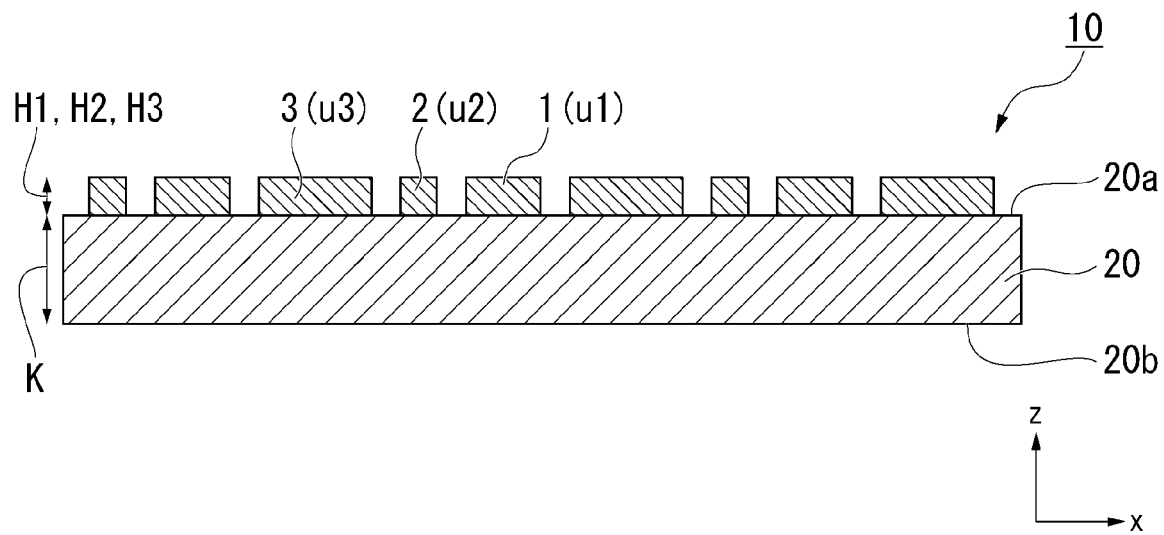
FIG. 8 is a cross-sectional view taken along a line VIII-VIII of the electromagnetic wave absorption film in FIG. 1.

FIG. 8 is a cross-sectional view taken along a line VIII-VIII of the electromagnetic wave absorption film 10 in FIG. 1.

The base 20 has two surfaces 20a and 20b which are opposite to each other. The first electromagnetic wave absorption pattern 1, the second electromagnetic wave absorption pattern 2, and the third electromagnetic wave absorption pattern 3 are formed on the surface 20a on one side of the base 20. As illustrated in FIG. 8, a plurality of first units u1, a plurality of second units u2, and a plurality of third units u3 are respectively provided on the surface 20a on one side of the base 20.

The base 20 is not particularly limited as long as it is planar and is in a form that allows the first electromagnetic wave absorption pattern 1, the second electromagnetic wave absorption pattern 2, and the third electromagnetic wave absorption pattern 3 to be formed on the surface 20a on one side of the base 20. The base 20 may have a single-layer structure or a multi-layer structure.

A thickness K of the base 20 may be, for example, from 5 to 500 [µm], from 15 to 200 [µm], or from 25 to 100 [µm].

A thickness H1 of the first electromagnetic wave absorption pattern 1, a thickness H2 of the second electromagnetic wave absorption pattern 2, and a thickness H3 of the third electromagnetic wave absorption pattern 3 are not particularly limited. The thickness H1, the thickness H2, and the thickness H3 can be changed as desired depending on the desired characteristic. Furthermore, the thickness H1, the thickness H2, and the thickness H3 may be the same as or different from each other.

The thickness H1, the thickness H2, and the thickness H3 may be, for example, from 1 to 100 [µm], from 5 to 50 [µm], or from 10 to 30 [µm]. The thicker each of the thickness H1, the thickness H2, and the thickness H3 is, the better the electromagnetic wave absorption is, but also the higher the production cost is. In view of this, the thickness H1, the thickness H2, and the thickness H3 may be set respectively.

A material of the base 20 can be appropriately selected according to the application of the electromagnetic wave absorption film. For example, the base 20 may be formed of a transparent material for the purpose of providing transparency to the electromagnetic wave absorption film. Alternatively, the base 20 may be formed of a flexible material for the purpose of providing conformability to a curved surface to the electromagnetic wave absorption film. A surface of the base 20 may be smoothed for the purpose of improving the transparency and three-dimensional formability of the electromagnetic wave absorption film.

For example, the base 20 can be formed of a resin. The resin may be a thermoplastic resin or a thermosetting resin. However, from the viewpoint of the three-dimensional formability of the electromagnetic wave absorption film 10, the base 20 preferably includes a thermoplastic resin.

Examples of the thermoplastic resin include a polyolefin resin, a polyester resin, a polyacrylic resin, a polystyrene resin, a polyimide resin, a polyimide amide resin, a polyamide resin, a polyurethane resin, a polycarbonate resin, a polyarylate resin, a melamine resin, an epoxy resin, a urethane resin, a silicone resin, and a fluororesin.

Specific examples of the polyolefin resin include polypropylene and polyethylene. Specific examples of the polyester resin include polyethylene terephthalate, polybutylene terephthalate, and polyethylene naphthalate.

Examples of the thermosetting resin include an epoxy resin composition, a resin composition that is cured through a urethane reaction, and a resin composition that is cured through a radical polymerization reaction. One type of these may be used alone, or two or more types may be used in combination.

The epoxy resin composition is a composition containing an epoxy resin and a curing agent. Specific examples of the epoxy resin include a polyfunctional epoxy resin, a bisphenol A epoxy resin, a bisphenol F epoxy resin, a biphenyl epoxy resin, and a dicyclopentadiene type epoxy resin.

Specific examples of the curing agent include an amine compound and a phenol-based curing agent.

Examples of the resin composition that is cured through a urethane reaction include a resin composition including a (meth)acrylic polyol and a polyisocyanate compound.

Examples of the resin composition that is cured through a radical polymerization reaction include: a (meth)acrylic resin having a radically polymerizable group in the side chain; and an unsaturated polyester.

Examples of the (meth)acrylic resin include: a resin formed by a reaction of a polymer of a vinyl monomer having a reactive group and a monomer having a group that can react with a reactive group derived from a vinyl monomer and having a radically polymerizable group; and an epoxy acrylate having a (meth)acrylic group in which (meth) acrylic acid or the like is reacted at the end of an epoxy resin.

Specific examples of the vinyl monomer having a reactive group include an acrylic monomer such as hydroxy (meth) acrylate and glycidyl (meth)acrylate.

Specific examples of the monomer having a group that can react with a reactive group derived from a vinyl monomer and having a radically polymerizable group include (meth)acrylic acid and an isocyanate group-containing (meth)acrylate.

Examples of the unsaturated polyester include an unsaturated polyester in which a carboxylic acid having an unsaturated group (such as fumaric acid) is condensed with a diol.

The base 20 may include an optional component within a range that does not impair the effects of the present invention. Examples of the optional component include, for example, an inorganic filler, a colorant, a curing agent, an anti-aging agent, a photostabilizer, a flame retardant, a conductive agent, an antistatic agent, and a plasticizer.

Examples of the inorganic filler include metal particles, metal oxide particles, metal hydroxide particles, and metal nitride particles. Specific examples include silver particles, copper particles, aluminum particles, nickel particles, zinc oxide particles, aluminum oxide particles, aluminum nitride particles, silicon oxide particles, magnesium oxide particles, aluminum nitride particles, titanium particles, boron nitride particles, silicon nitride particles, silicon carbide particles, diamond particles, graphite particles, carbon nanotube particles, metal silicon particles, carbon fiber particles, fullerene particles and glass particles.

Specific examples of the colorant include an inorganic pigment, an organic pigment, and a dye.

One type of these may be used alone, or two or more types may be used in combination.

From the viewpoint of improvement in the electromagnetic wave absorption performance of the electromagnetic wave absorption film 10, the thickness, permittivity, electrical conductivity, and magnetic permeability of the base 20 can be set as appropriate.

When the electrical properties of electromagnetic waves to be absorbed are taken into consideration, the base 20 may be a high-permittivity layer. When the base 20 is a high-permittivity layer, a thickness of the electromagnetic wave absorption film 10 can be relatively thin.

For the purpose of application of the electromagnetic wave absorption film 10 to a surface of various articles, the surface 20b on one side of the base 20 may be adhesive. When the surface 20b on one side of the base 20 is adhesive, a release film covering the surface 20b may be provided. The release film is removed when the electromagnetic wave absorption film 10 is in use. When the release film covers the adhesive surface, handling during distribution becomes easier.

For example, when a multi-layer structure is employed, in which the surface 20b on one side of the base 20 is an adhesive layer containing an adhesive, the surface 20b on one side of the base 20 can be made adhesive.

Examples of the adhesive include a heat seal type adhesive that is activated by heat; an adhesive that is activated by moisture; and a pressure-sensitive adhesive that is activated by pressure. Among these, from the viewpoint of convenience, a pressure-sensitive adhesive is preferable.

Specific examples of the pressure-sensitive adhesive include an acrylic-based pressure-sensitive adhesive, a urethane-based pressure-sensitive adhesive, a rubber-based pressure-sensitive adhesive, a polyester-based pressure-sensitive adhesive, a silicone-based pressure-sensitive adhesive, and a polyvinyl ether-based pressure-sensitive adhesive. Among these, at least one selected from the group consisting of an acrylic-based pressure-sensitive adhesive, a urethane-based pressure-sensitive adhesive, and a rubber-based pressure-sensitive adhesive is preferable, and an acrylic-based pressure-sensitive adhesive is more preferable.

Examples of the acrylic-based pressure-sensitive adhesive include an acrylic-based polymer described below.
Acrylic-based polymer (1) containing a constituent unit derived from an alkyl (meth)acrylate having a linear alkyl group or a branched alkyl group (that is, a polymer formed by polymerization of at least an alkyl (meth)acrylate as a monomer).
Acrylic-based polymer (2) containing a constituent unit derived from a (meth)acrylate having a cyclic structure (that is, a polymer formed by polymerization of at least a (meth)acrylate having a cyclic structure).

The acrylic-based polymer may be a homopolymer or a copolymer. When the acrylic-based polymer is a copolymer, the form of copolymerization is not particularly limited. The acrylic-based copolymer may be a block copolymer, a random copolymer, or a graft copolymer.

The acrylic-based pressure-sensitive adhesive is preferably an acrylic-based copolymer (Q) described below.
Acrylic-based copolymer (Q): a copolymer containing a constituent unit (q1) derived from an alkyl (meth) acrylate having a chain alkyl group having from 1 to 20 carbons (hereinafter referred to as "monomer component [q1']") and a constituent unit (q2) derived from a functional group-containing monomer (hereinafter referred to as "monomer component [q2']").

The acrylic-based copolymer (Q) may further contain another constituent unit (q3) in addition to the constituent unit (q1) and the constituent unit (q2). The constituent unit (q3) is a constituent unit derived from a monomer component (q3') that is neither the monomer component (q1') nor the monomer component (q2').

From the viewpoint of improvement in an adhesive property, the number of carbons of the chain alkyl group contained in the monomer component (q1') is preferably from 1 to 12, more preferably from 4 to 8, and even more preferably from 4 to 6. Specific examples of the monomer component (q1') include methyl (meth)acrylate, ethyl (meth)acrylate, propyl (meth)acrylate, n-butyl (meth)acrylate, 2-ethylhexyl (meth)acrylate, lauryl (meth)acrylate, tridecyl (meth)acrylate, and stearyl (meth)acrylate. Among these, butyl (meth) acrylate and 2-ethylhexyl (meth)acrylate are preferable, and butyl (meth)acrylate is more preferable.

One type of these may be used alone, or two or more types may be used in combination.

Examples of the monomer component (q2') include a hydroxy group-containing monomer, a carboxy group-containing monomer, an epoxy group-containing monomer, an amino group-containing monomer, a cyano group-containing monomer, a keto group-containing monomer, and an alkoxysilyl group-containing monomer. Among these, a hydroxy group-containing monomer and a carboxy group-containing monomer are preferable.

Specific examples of the hydroxy group-containing monomer include 2-hydroxyethyl (meth)acrylate, 2-hydroxypropyl (meth)acrylate, 2-hydroxybutyl (meth)acrylate, 3-hydroxybutyl (meth)acrylate, and 4-hydroxybutyl (meth)acrylate. Among these, 2-hydroxyethyl (meth)acrylate is preferable.

Specific examples of the carboxy group-containing monomer include (meth)acrylic acid, maleic acid, fumaric acid, and itaconic acid, of which (meth)acrylic acid is preferable.

Specific examples of the epoxy group-containing monomer include glycidyl (meth)acrylate and the like.

Specific examples of the amino group-containing monomer include diaminoethyl (meth)acrylate and the like.

Specific examples of the cyano group-containing monomer include acrylonitrile and the like.

One type of these may be used alone, or two or more types may be used in combination.

Examples of the monomer component (q3') include: a (meth)acrylate having a cyclic structure, such as cyclohexyl (meth)acrylate, benzyl (meth)acrylate, isobornyl (meth)acrylate, dicyclopentanyl (meth)acrylate, dicyclopentenyl (meth)acrylate, dicyclopentenyloxyethyl (meth)acrylate, imide (meth)acrylate, and acryloyl morpholine; vinyl acetate; and styrene.

One type of these may be used alone, or two or more types may be used in combination.

A content of the constituent unit (q1) is preferably from 50 to 99.5 mass %, more preferably from 55 to 99 mass %, further preferably from 60 to 97 mass %, and particularly preferably from 65 to 95 mass %, per 100 mass % of the total constituent units of the acrylic-based copolymer (Q).

A content of the constituent unit (q2) is preferably from 0.1 to 50 mass %, more preferably from 0.5 to 40 mass %, further preferably from 1.0 to 30 mass %, and particularly preferably from 1.5 to 20 mass %, per 100 mass % of the total constituent units of the acrylic-based copolymer (Q).

A content of the constituent unit (q3) is preferably from 0 to 40 mass %, more preferably from 0 to 30 mass %, further preferably from 0 to 25 mass %, and particularly preferably from 0 to 20 mass %, per 100 mass % of the total constituent units of the acrylic-based copolymer (Q).

The acrylic-based copolymer may be crosslinked with a crosslinking agent. Examples of the crosslinking agent include an epoxy-based crosslinking agent, an isocyanate-based crosslinking agent, an aziridine-based crosslinking agent, and a metal chelate-based crosslinking agent. When crosslinking the acrylic-based copolymer, the functional group derived from the monomer component (q2') can be used as a crosslinking point that reacts with the crosslinking agent.

For the purpose of improvement in impact resistance and the like, the adhesive layer may be formed of a material that is cured by energy rays such as ultraviolet rays, visible energy rays, infrared rays, and electron beams. In this case, the adhesive layer contains an energy ray-curable component.

Examples of the energy ray-curable component include a compound having two or more ultraviolet light polymerizable functional groups in one molecule in a case where the energy rays are ultraviolet rays. Specific examples of the compound having two or more ultraviolet light polymerizable functional groups in one molecule include trimethylolpropane tri(meth)acrylate, ethoxylated isocyanurate tri (meth)acrylate, ditrimethylolpropane tetra(meth)acrylate, tetramethylolmethane tetra(meth)acrylate, pentaerythritol tri (meth)acrylate, dipentaerythritol monohydroxypenta(meth) acrylate, dipentaerythritol hexa(meth)acrylate, caprolactone-modified dipentaerythritol hexa(meth)acrylate, 1,4-butylene glycol di(meth)acrylate, 1,6-hexanediol di(meth) acrylate, dicyclopentadiene dimethoxy di(meth)acrylate, polyethylene glycol di(meth)acrylate, oligoester (meth)acrylate, urethane (meth)acrylate oligomer, epoxy-modified (meth)acrylate, and polyether (meth)acrylate. One type of these may be used alone, or two or more types may be used in combination.

When the adhesive layer is energy ray-curable, use of a photopolymerization initiator in combination is preferable. The photopolymerization initiator increases the curing rate.

Specific examples of the photopolymerization initiator include benzophenone, acetophenone, benzoin, benzoin methyl ether, benzoin ethyl ether, benzoin isopropyl ether, benzoin isobutyl ether, benzoin benzoic acid, methyl benzoin benzoic acid, benzoin dimethyl ketal, 2,4-diethylthioxanthone, 1-hydroxycyclohexylphenylketone, benzyldiphenylsulfide, tetramethylthiuram monosulfide, azobisisobutyronitrile, benzyl, dibenzyl, diacetyl, 2-chloroanthraquinone, 2,4,6-trimethylbenzoyldiphenylphosphine oxide, 2-benzothiazole-N,N-diethyldithiocarbamate, and oligo{2-hydroxy-2-methyl-1-[4-(1-propenyl)phenyl]propanone}.

The electromagnetic wave absorption film 10 can be produced by, for example, the following method.

First, a base 20 is prepared. Next, a first electromagnetic wave absorption pattern 1, a second electromagnetic wave absorption pattern 2, and a third electromagnetic wave absorption pattern 3 are formed on a surface 20a on one side of the base 20.

Here, the first electromagnetic wave absorption pattern 1 is formed such that the value of a frequency, at which an absorption amount of an electromagnetic wave absorbed by the first electromagnetic wave absorption pattern 1 exhibits its local maximum value, is A [GHz].

The second electromagnetic wave absorption pattern 2 is formed such that the value of a frequency, at which an absorption amount of an electromagnetic wave absorbed by the second electromagnetic wave absorption pattern 2 exhibits its local maximum value, is B [GHz].

The third electromagnetic wave absorption pattern 3 is formed such that the value of a frequency, at which an absorption amount of an electromagnetic wave absorbed by the third electromagnetic wave absorption pattern 3 exhibits its local maximum value, is C [GHz].

An order of formation of the first electromagnetic wave absorption pattern 1, the second electromagnetic wave absorption pattern 2, and the third electromagnetic wave absorption pattern 3 is not particularly limited. The first electromagnetic wave absorption pattern 1, the second electromagnetic wave absorption pattern 2, and the third electromagnetic wave absorption pattern 3 may be formed in the same process or may be formed in separate processes.

A method for forming each of the electromagnetic wave absorption patterns is not particularly limited as long as the electromagnetic wave absorption pattern can be formed so as to absorb a predetermined frequency. Examples of a method for forming each of the electromagnetic wave absorption patterns include the following methods.

- A printing method, in which, using a conductive paste, each of the electromagnetic wave absorption patterns is printed on the surface 20a on one side of the base 20.
- A development method, in which each of the electromagnetic wave absorption patterns is developed on the surface 20a on one side of the base 20.
- A method including providing a thin metal film on the surface 20a on one side of the base 20 by a sputtering method, vacuum deposition, or lamination of metal foil and then forming a pattern of thin metal film on the surface 20a on one side of the base 20 by photolithography.
- A method of disposing a metal wire on the surface 20a on one side of the base 20.

In the printing method, each of the electromagnetic wave absorption patterns is printed on the surface 20a on one side of the base 20, and thus each of the units u1, u2, and u3, which is a figure, is formed. The printing method is not particularly limited. Examples of the printing method include screen printing, gravure printing, and inkjet printing.

Examples of the conductive paste used in printing include a paste-like composition containing a binder resin component and at least one selected from the group consisting of metal particles, carbon nanoparticles, and carbon fibers. Examples of the metal particles include particles of a metal such as copper, silver, nickel, and aluminum. Examples of the binder resin component include: a thermoplastic resin such as a polyester resin, a (meth)acrylic resin, a polystyrene resin, and a polyamide resin; and a thermosetting resin such as an epoxy resin, an amino resin, and a polyimide resin. However, the metal particles and the binder resin component are not limited to these examples.

The conductive paste may further include a black pigment such as a carbon black. When the conductive paste further includes a black pigment, the metallic luster of a metal powder constituting a printed electromagnetic wave absorption pattern can be suppressed, and reflection of external light can be suppressed.

In the development method, the electromagnetic wave absorption patterns are developed on the surface 20a on one side of the base 20, and thus each of the units u1, u2, and u3, which is a figure, is formed.

The development method includes a negative development method, in which a development target is expressed in an exposed portion that is not covered by an exposure mask, and a positive development method, in which a development target is expressed in an unexposed portion that is covered by an exposure mask. In other words, in the negative development method, each of the units u1, u2, and u3 is formed as a development target having an inversed pattern relative to the exposure mask. Meanwhile, in the positive type development method, each of the units u1, u2, and u3 is formed as a development target having the same pattern as the exposure mask. Silver is typically used as a metal used in the development target.

An example of a method of forming an electromagnetic wave absorption pattern by photolithography is, for example, the following method.

First, a resist is applied to a surface of the base 20, and heat treatment is performed; thereafter, a solvent is removed from the resist. Next, a desired pattern is exposed on the resist, and a resist pattern is developed to form a layer of the resist pattern. Next, a vapor deposition film is formed over the entire surface of the base and the layer of the resist pattern; then, using a resist stripping agent, the layer of the resist pattern and the vapor deposition film disposed at the layer of the resist pattern are simultaneously removed. In this way, an electromagnetic wave absorption pattern can be formed at a surface of the base.

As another example, a thin metal film is provided on the base 20; then, a portion of the surface of the thin metal film is coated with a resist, and heat treatment is performed. Next, using an etching process, the thin metal film is removed from the portion of the base where the resist has not been applied. Thereafter, the resist is removed as necessary, forming an electromagnetic wave absorption pattern. A metal plating layer (not illustrated) may be further provided at a surface of each of the units u1, u2, and u3 constituting each of the electromagnetic wave absorption patterns.

Specific examples of a metal constituting the metal wire include the same metals as those described above for the materials of each of the units u1, u2, and u3. In addition, the metal wire may be plated with tin, zinc, silver, nickel, chromium, nickel chromium alloy, or solder, or, the surface of the metal wire may be covered with a carbon material or a polymer. Examples of the carbon material coating the surface of the metal wire include: an amorphous carbon, such as carbon black, activated carbon, hard carbon, soft carbon, mesoporous carbon, and carbon fibers; graphites; fullerenes; graphenes; and carbon nanotubes.

(Mechanism)

As described above, the electromagnetic wave absorption film according to an embodiment of the present invention has a first electromagnetic wave absorption pattern with which a value of a frequency, at which an absorption amount of an electromagnetic wave absorbed exhibits its local maximum value, is A [GHz], a second electromagnetic wave absorption pattern with which a value of a frequency, at which an absorption amount of an electromagnetic wave absorbed exhibits its local maximum value, is B [GHz], and a third electromagnetic wave absorption pattern with which a value of a frequency, at which an absorption amount of an electromagnetic wave absorbed exhibits its local maximum value, is C [GHz]. Also, the first electromagnetic wave absorption pattern, the second electromagnetic wave absorption pattern, and the third electromagnetic wave absorption pattern are formed on the same planar base.

Therefore, electromagnetic waves absorbed by each of the electromagnetic wave absorption patterns sufficiently overlap each other, and the frequency band of electromagnetic waves that can be absorbed by the entire electromagnetic wave absorption film becomes wider. As a result, even in a case in which an absorption characteristic of the electromagnetic wave absorption film may deviate from a predetermined frequency due to the effect of a member in the surrounding environment, a probability that the frequency after the deviation falls within the frequency band that can be absorbed by the entire electromagnetic wave absorption film is drastically higher compared to the known art.

Accordingly, the electromagnetic wave absorption film according to an embodiment of the present invention is less susceptible to the surrounding environment, including placement of a material in the surrounding environment and the temperature of the surrounding environment, making it possible to sufficiently absorb electromagnetic waves of a frequency designed to be absorbed.

(Electromagnetic Wave Absorption Sheet)

An electromagnetic wave absorption sheet according to an embodiment of the present invention will be described below.

Figure 9:
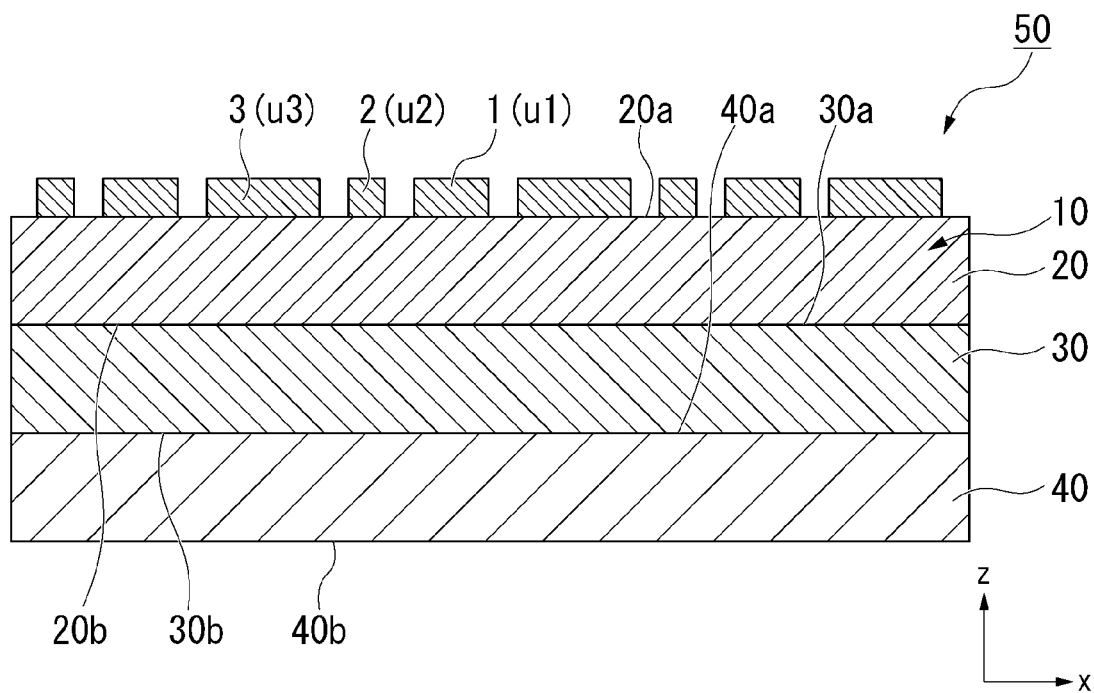
FIG. 9 is a cross-sectional view illustrating an example of an electromagnetic wave absorption sheet of the present invention.
Figure 10:
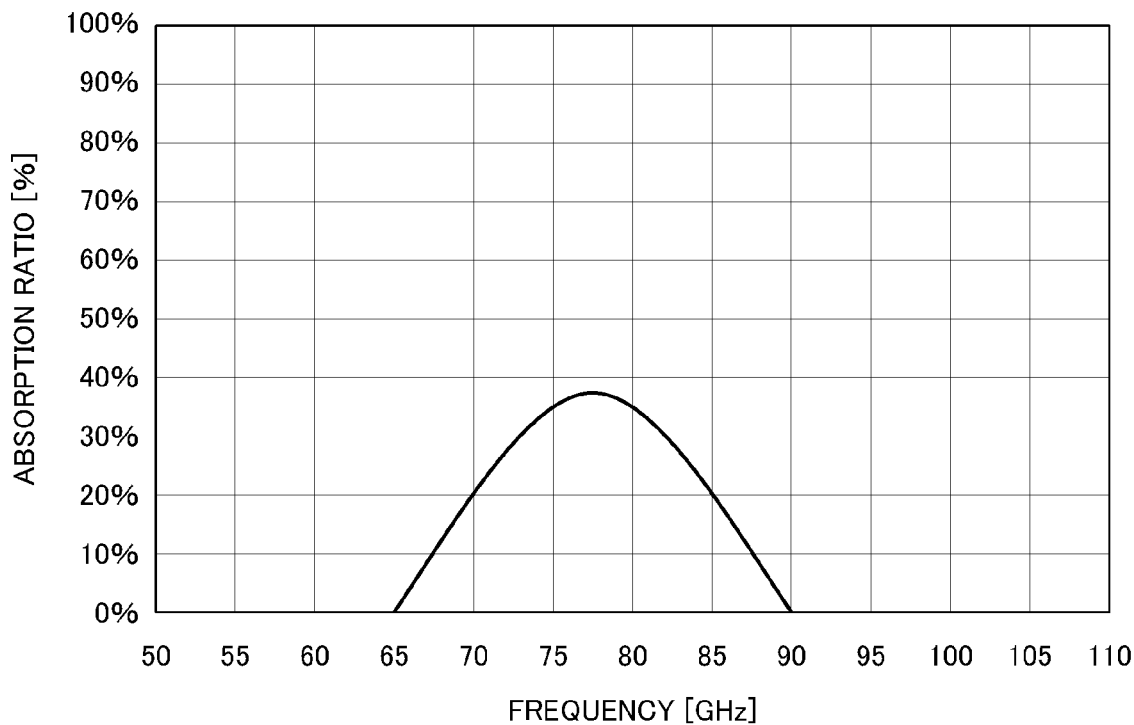
FIG. 10 is a prediction chart of an absorption spectrum of electromagnetic waves inferred from measurement results of an electromagnetic wave absorption film of Example 1.
Figure 11:
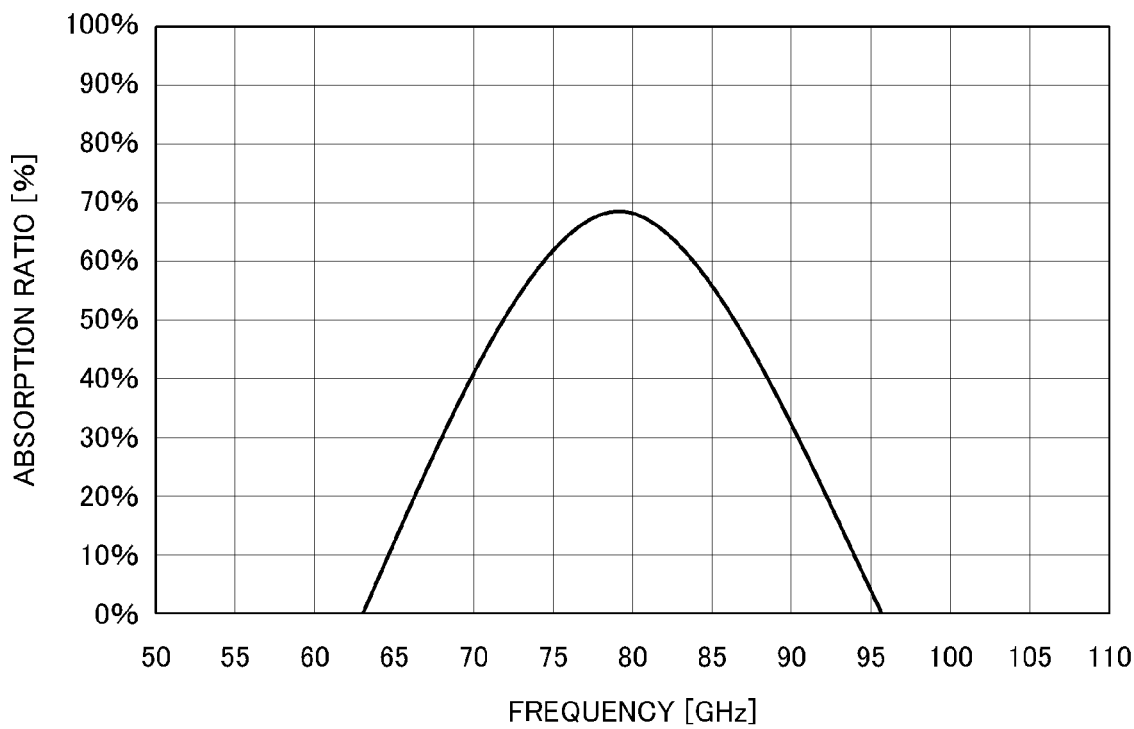
FIG. 11 is a prediction chart of an absorption spectrum of electromagnetic waves inferred from measurement results of an electromagnetic wave absorption film of Example 2.
Figure 12:
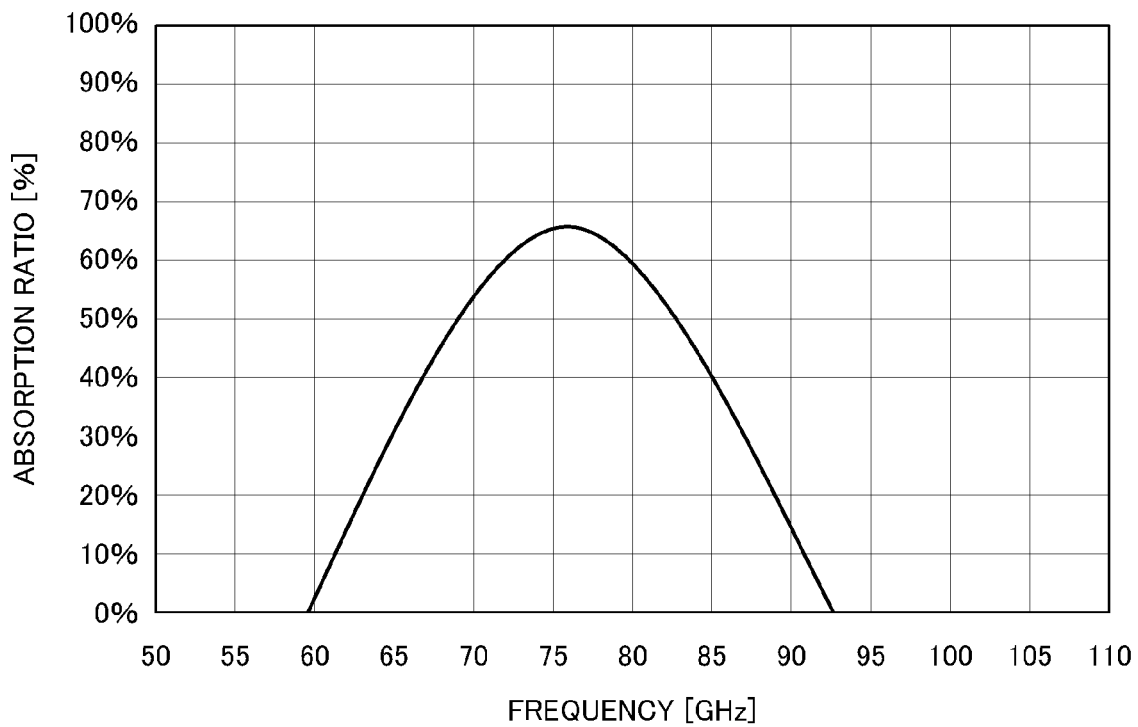
FIG. 12 is a prediction chart of an absorption spectrum of electromagnetic waves inferred from measurement results of an electromagnetic wave absorption film of Example 3.
Figure 13:
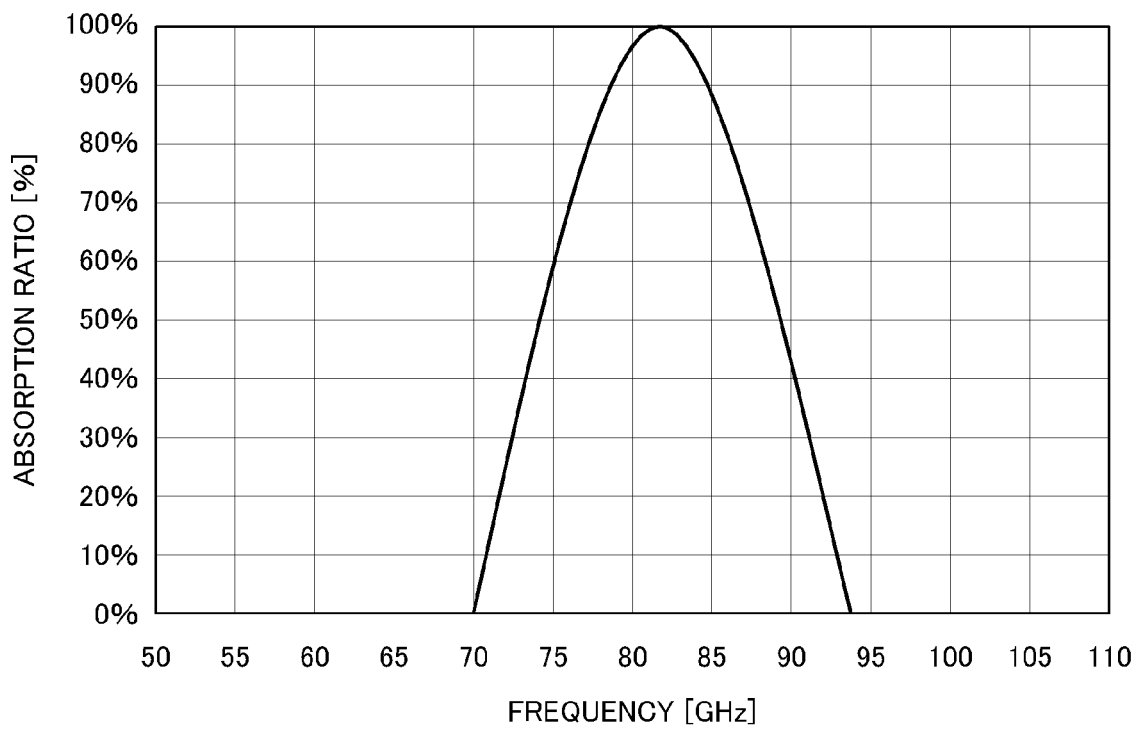
FIG. 13 is a prediction chart of an absorption spectrum of electromagnetic waves inferred from measurement results of an electromagnetic wave absorption sheet of Example 4.
Figure 14:
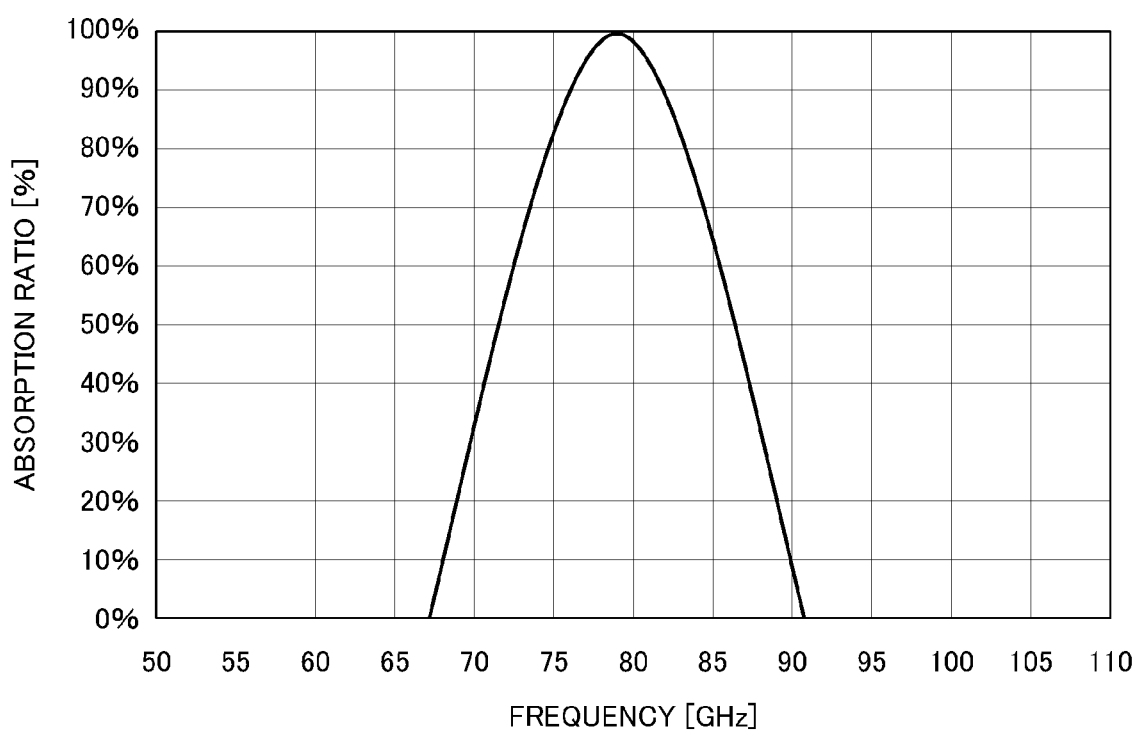
FIG. 14 is a prediction chart of an absorption spectrum of electromagnetic waves inferred from measurement results of an electromagnetic wave absorption sheet of Example 5.

FIG. 9 is a cross-sectional view illustrating an example of an electromagnetic wave absorption sheet according to an embodiment of the present invention.

As illustrated in FIG. 9, an electromagnetic wave absorption sheet 50 has the electromagnetic wave absorption film 10 according to an embodiment of the present invention, a spacer film 30, and a reflective film 40.

(Spacer Film)

The spacer film 30 is provided on the surface 20b on one side of the base 20 of the electromagnetic wave absorption film 10.

The spacer film 30 has two surfaces, 30a and 30b. The surface 30a on one side of the spacer film 30 is in contact with the surface 20b on one side of the base 20. The reflective film 40 is provided at the surface 30b on one side of the spacer film 30.

The spacer film 30 may have a single-layer structure or a multi-layer structure.

A material of the spacer film 30 can be appropriately selected according to the application of the electromagnetic wave absorption film. For example, the spacer film 30 may be formed of a transparent material for the purpose of providing transparency to the electromagnetic wave absorption film. In addition, the spacer film 30 may be formed of a flexible material for the purpose of providing conformability to a curved surface to the electromagnetic wave absorption film.

Examples of the flexible material include a plastic film, a rubber, a paper, a fabric, a nonwoven fabric, a foam sheet, and a rubber sheet. Among these, from the viewpoint of conformability of the electromagnetic wave absorption sheet 50 to a curved surface, a foam sheet is preferable.

Specific examples of a resin constituting the plastic film include the same resins as the thermoplastic resins described for the aforementioned base 20.

Examples of the foam sheet include a foam sheet formed into a sheet by foaming the resin constituting the plastic film. Specific examples of the foam sheet include polyethylene foam, polypropylene foam, and polyurethane foam.

In consideration of the wavelength reduction effect of the spacer film 30, a thickness of the spacer film 30 is appropriately modified according to the wavelength of an electromagnetic wave to be absorbed and the relative permittivity of the spacer film 30.

In consideration of the wavelength reduction effect of the spacer film 30, it is preferable that the thickness of the spacer film 30 in the z-axis direction satisfies Equation (8) below.

(Thickness of the spacer film 30 in the z-axis direction)=$(\lambda) \times (1/4)/(\varepsilon)^{1/2}$　　　Equation (8)

In Equation (8), $\lambda$ is the wavelength of an incoming electromagnetic wave, and F is the relative permittivity of the spacer film 30.

When the relationship between the thickness of the spacer film 30 in the z-axis direction and the wavelength $\lambda$ satisfies Equation (8), the electromagnetic wave absorption sheet 50 has a so-called $\lambda/4$ structure. As a result, a local maximum value of an absorption amount of an electromagnetic wave absorbed by the electromagnetic wave absorption sheet 50 is further increased.

The thickness of the spacer film 30 can be appropriately set according to the wavelength $\lambda$ of an electromagnetic wave to be absorbed. The thickness of the spacer film 30 may be, for example, from 25 to 5000 [μm], from 50 to 4500 [μm], or from 100 to 4000 [μm].

The spacer film 30 may be formed of a high-permittivity material. When the spacer film 30 is a high-permittivity layer, the thickness of the spacer film 30 can be relatively small.

In consideration of the permittivity of the spacer film 30, the spacer film 30 preferably includes at least one selected from the group consisting of barium titanate, titanium oxide, and strontium titanate.

The spacer film 30 preferably includes at least one selected from the group consisting of a plastic film, a foam sheet, and a rubber sheet; among these, the spacer film 30 more preferably includes a foam sheet. When the spacer film 30 is at least one selected from the group consisting of a plastic film, a foam sheet, and a rubber sheet, the conformability of the electromagnetic wave absorption sheet 50 to a curved surface is improved.

The spacer film 30 may be a single-layer structure of a single sheet or a multi-layer structure that is a laminate of a plurality of sheets. A material and structure of a sheet constituting the spacer film 30 can be appropriately selected according to the application of the electromagnetic wave absorption sheet.

The two surfaces 30a and 30b of the spacer film 30 are preferably adhesive. As a result, the electromagnetic wave absorption film 10 and the reflective film 40 can be attached to the two surfaces 30a and 30b, respectively. For example, when the spacer film 30 employs a multi-layer structure, in which the two surfaces 30a and 30b are an adhesive layer containing an adhesive, the two surfaces 30a and 30b can be made adhesive.

The details and preferred aspects of the adhesive layer may be the same as those described for the adhesive layer of the base 20.

(Reflective Film)

The reflective film 40 is provided at the surface 30b on one side of the spacer film 30.

The reflective film 40 has two surfaces, 40a and 40b. The surface 40a on one side of the reflective film 40 is in contact with the surface 30b on one side of the spacer film 30.

The reflective film 40 is not particularly limited as long as the reflective film 40 is one that is capable of reflecting electromagnetic waves that travel to a surface of the electromagnetic wave absorption film 10 and pass through the electromagnetic wave absorption film 10. The electromagnetic waves, which travel to the electromagnetic wave absorption sheet 50, are partially reflected by the electromagnetic wave absorption film 10 or partially absorbed by the electromagnetic wave absorption film 10. Meanwhile, electromagnetic waves that are neither reflected nor absorbed by the electromagnetic wave absorption film 10 pass through the electromagnetic wave absorption film 10. Electromagnetic waves that have passed through the electromagnetic wave absorption film 10 are reflected back toward the electromagnetic wave absorption film 10 by the reflective film 40.

For example, when the reflective film 40 is electrically conductive in the planar direction of the two surfaces 40a and 40b, the reflective film 40 can reflect the electromagnetic waves that have passed through the electromagnetic wave absorption film 10. Specifically, for the reflective film 40, an article in which a metal foil such as a copper foil is attached to a resin film such as a polyethylene terephthalate film may be used. Instead of a metal foil, a transparent conductive film such as an ITO film or a mesh sheet formed of a metal wire can also be used.

In consideration of the reflection characteristic of the reflective film 40, a metal wire, a conductive yarn, a plied yarn including a metal wire and a conductive yarn, or a thin conductive film may be provided on the surface of the surface 40b on one side of the reflective film 40. The thin conductive film can be provided on the surface 40b by, for example, a printing method such as screen printing, gravure printing, and inkjet printing; sputtering or vacuum deposition; and photolithography.

When the spacer film 30 is applied to an object having conductivity such as a metal object, the reflective film 40 can be omitted because the object having conductivity such as a metal object acts in the capacity of the reflective film 40.

The electromagnetic wave absorption sheet 50 according to an embodiment of the present invention described above has the electromagnetic wave absorption film 10 according to an embodiment of the present invention, and therefore is less susceptible to the surrounding environment, including the placement of a material in the surrounding environment and the temperature of the surrounding environment, making it possible to sufficiently absorb electromagnetic waves of which the frequency has deviated.

In addition, the electromagnetic wave absorption sheet 50 further has the spacer film 30 and the reflective film 40; as a result, the reflective film 40 can effectively reflect electromagnetic waves that travel to a surface of the electromagnetic wave absorption film 10 and pass through the electromagnetic wave absorption film 10. Thereafter, electromagnetic waves reflected by the reflective film 40 are again absorbed or reflected by the electromagnetic wave absorption film 10, thereby increasing the absorption amount of electromagnetic waves absorbed by the entire electromagnetic wave absorption sheet 50.

EXAMPLES

Hereinafter, the present invention will be described in detail with reference to examples, but the present invention is not limited to the following description.
(Measurement Method)
(Peak Value of Absorption Ratio)

The reflection characteristic (S11) and the transmission characteristic (S21) of electromagnetic wave absorption films or electromagnetic wave absorption sheets produced were measured using a vector network analyzer ("N5290A", available from Keysight Technologies Inc.) using a free space-type S parameter method. Next, the absorption ratio was calculated in accordance with Equation (9) below, and the value of the frequency at which the curve of the absorption ratio exhibited its local maximum value was determined. And thus, the peak value of absorption ratio was obtained. In the present Examples and the Comparative Examples, the reflection characteristic (S11) and the transmission characteristic (S21) were measured in the 50 to 110 [GHz] band.

Absorption Ratio [%]=100−Reflection Ratio (S11)− Transmission Ratio (S21)   Equation (9)

(Peak Width of Absorption Amount)

The reflection characteristic (S11) and the transmission characteristic (S21) in the frequency band from 50 to 110 [GHz] of electromagnetic wave absorption films or electromagnetic wave absorption sheets produced were measured using a vector network analyzer ("N5290A", available from Keysight Technologies Inc.) using a free space-type S parameter method, and the absorption ratio was calculated in accordance with Equation (9). Then, the frequency was plotted on the horizontal axis while the absorption ratio calculated was plotted on the vertical axis, hence creating an absorption spectrum chart.

In this absorption spectrum chart, the half-value width of the peak at which the absorption ratio reached its maximum value was defined as the peak width of the absorption amount. That is, the width (half width) of the peak in the horizontal-axis direction when the peak height in the vertical-axis direction was 50% of the maximum value was defined as the peak width of the absorption amount.

Example 1

A first electromagnetic wave absorption pattern, a second electromagnetic wave absorption pattern, and a third electromagnetic wave absorption pattern were formed on a 50 [μm]-thick PET film containing polyethylene terephthalate, resulting in an electromagnetic wave absorption film of Example 1 as illustrated in FIG. 1. The spacings d1, d2, and d3 between each pattern illustrated in FIG. 1 was 1 [mm].

The shapes of the first electromagnetic wave absorption pattern, the second electromagnetic wave absorption pattern, and the third electromagnetic wave absorption pattern were cross shapes as illustrated in FIGS. 3, 5, and 7, respectively. The first electromagnetic wave absorption pattern, the second electromagnetic wave absorption pattern, and the third electromagnetic wave absorption pattern all had a thickness of 18 [μm]. Furthermore, the first electromagnetic wave absorption pattern, the second electromagnetic wave absorption pattern, and the third electromagnetic wave absorption pattern all used copper as a material.

As presented in Table 1, L1 in FIG. 3 was 1.3 mm, L2 in FIG. 5 was 1.2 [mm], and L3 in FIG. 7 was 1.4 [mm]. In this case, as presented in Table 2, the first electromagnetic wave absorption pattern composed of the first units u1 absorbed an electromagnetic wave of a frequency A of 79 [GHz]. That is, the peak of the absorption amount of an electromagnetic wave absorbed by the first electromagnetic wave absorption pattern fell in the frequency band of 79 [GHz].

Furthermore, the second electromagnetic wave absorption pattern composed of the second units u2 absorbed an electromagnetic wave of a frequency B of 86 [GHz]. That is, the peak of the absorption amount of an electromagnetic wave absorbed by the second electromagnetic wave absorption pattern fell in the frequency band of 86 [GHz].

In addition, the third electromagnetic wave absorption pattern composed of the third units u3 absorbed an electromagnetic wave of a frequency C of 76 [GHz]. That is, the peak of the absorption amount of an electromagnetic wave absorbed by the third electromagnetic wave absorption pattern fell in the frequency band of 76 [GHz].

Example 1 produced an electromagnetic wave absorption film in which the three types of electromagnetic wave absorption patterns described above were formed on a base.

Note that a frequency, at which an absorption amount of an electromagnetic wave absorbed by each of the electromagnetic wave absorption patterns exhibited its local maximum value, was measured by Method X described above.

Example 2

An electromagnetic wave absorption film of Example 2 was produced in the same manner as in Example 1 with the exception that the lengths of L2 and L3 were modified as presented in Table 1.

In this case, the frequencies A, B, and C of electromagnetic waves selectively absorbed by each of the electromagnetic wave absorption patterns were as presented in Table 2.

Example 2 produced an electromagnetic wave absorption film in which electromagnetic wave absorption patterns that selectively absorbed three types of electromagnetic waves of the frequencies A, B, and C presented in Table 2 were formed on a base.

Example 3

An electromagnetic wave absorption film of Example 3 was produced in the same manner as in Example 1 with the exception that an electromagnetic wave absorption pattern 2a, an electromagnetic wave absorption pattern 2b, an electromagnetic wave absorption pattern 3a, and an electromagnetic wave absorption pattern 3b as described below were formed at the PET film in addition to the first electromagnetic wave absorption pattern, the second electromagnetic wave absorption pattern, and the third electromagnetic wave absorption pattern, and that the lengths of L2 and L3 were modified as presented in Table 1.

Electromagnetic wave absorption pattern 2a: An electromagnetic wave absorption pattern with which a value of a frequency at which an absorption amount of an electromagnetic wave absorbed exhibited its local maximum value was D [GHz], D satisfying Expression (4) below.

Electromagnetic wave absorption pattern 2b: An electromagnetic wave absorption pattern with which a value of a frequency at which an absorption amount of an electromagnetic wave absorbed exhibited its local maximum value was E [GHz], E satisfying Expression (5) below.

Electromagnetic wave absorption pattern 3a: An electromagnetic wave absorption pattern with which a value of a frequency at which an absorption amount of an electromagnetic wave absorbed exhibited its local maximum value was F [GHz], F satisfying Expression (6) below.

Electromagnetic wave absorption pattern 3b: An electromagnetic wave absorption pattern with which a value of a frequency at which an absorption amount of an electromagnetic wave absorbed exhibited its local maximum value was G [GHz], G satisfying Expression (7) below.

$1.037 \times A \leq D < 1.09 \times A$  Expression (4)

$1.09 \times A \leq E < 1.17 \times A$  Expression (5)

$0.91 \times A < F \leq 0.963 \times A$  Expression (6)

$0.83 \times A < G \leq 0.91 \times A$  Expression (7)

Here, the electromagnetic wave absorption pattern 2a was composed of a second unit u2a. In the same manner, the electromagnetic wave absorption pattern 2b, the electromagnetic wave absorption pattern 3a, and the electromagnetic wave absorption pattern 3b were composed of a second unit u2b, a third unit u3a, and a third unit u3b, respectively.

The shapes of the second unit u2a, the second unit u2b, the third u3a, and the third u3b units were all cross shapes that were the same as that of the first unit u1.

Each of the values of a length L4 of the second unit u2a in the x-axis direction, a length L5 of the second unit u2b in the x-axis direction, a length L6 of the third unit u3a in the x-axis direction, and a length L7 of the third unit u3b in the x-axis direction was presented in Table 1. In addition, the spacings between each of the electromagnetic wave absorption patterns were 1 [mm].

In this case, the frequencies of electromagnetic waves selectively absorbed by each of the electromagnetic wave absorption patterns were as presented in Table 2. In this way, Example 3 produced an electromagnetic wave absorption film in which electromagnetic wave absorption patterns that selectively absorbed the seven types of frequencies presented in Table 2 were formed on the base.

Example 4

An acrylic plate having a thickness of 2.2 [mm] was provided as a spacer film at the back surface of the electromagnetic wave absorption film produced in Example 2. Furthermore, a copper foil having a thickness of 18 [μm] was provided at the surface of the acrylic film, resulting in an electromagnetic wave absorption sheet having a spacer film and a reflective film. Here, the electromagnetic wave absorption sheet of Example 4 was produced in a manner that the sheet has a so-called k/4 structure.

Example 5

Four pieces of 0.71 [mm]-thick double-sided tape having polyethylene foam as the base material (Tackliner TL-54-06, available from LINTEC Corporation) were attached to the back surface of the electromagnetic wave absorption film produced in Example 2, resulting in a 2.84 [mm]-thick spacer film having a multi-layer structure. Furthermore, a copper foil having a thickness of 18 [μm] was provided at the surface of the acrylic film, resulting in an electromagnetic wave absorption sheet having a spacer film and a reflective film. Here, the electromagnetic wave absorption sheet of Example 5 was produced in a manner that the sheet has a so-called k/4 structure.

Comparative Example 1

An electromagnetic wave absorption film of Comparative Example 1 was produced in the same manner as in Example 1 with the exception that only the first units u1 constituting the first electromagnetic wave absorption pattern were provided on the PET film at a 1 [mm] spacing.

Comparative Example 2

An acrylic film having a thickness of 2.2 [mm] was provided as a spacer film at the back surface of the electromagnetic wave absorption film produced in Comparative Example 1. Furthermore, a copper foil having a thickness of 18 [μm] was provided at the surface of the acrylic film, resulting in an electromagnetic wave absorption sheet having a spacer film and a reflective film. Here, the electromagnetic wave absorption sheet of Comparative Example 2 was produced in a manner that the sheet has a so-called k/4 structure.

Comparative Example 3 and Comparative Example 4

Electromagnetic wave absorption films of Comparative Example 3 and Comparative Example 4 were produced in the same manner as in Example 1 with the exception that the lengths of L2 and L3 were changed as presented in Table 1.

In this case, the frequencies of electromagnetic waves selectively absorbed by each of the electromagnetic wave absorption patterns were as presented in Table 2.

Comparative Example 3 and Comparative Example 4 produced electromagnetic wave absorption films in which electromagnetic wave absorption patterns that selectively absorbed the three types of frequencies presented in Table 2 were formed on the base.

TABLE 1

|  | L1 (mm) | L2 (mm) | L3 (mm) | L4 (mm) | L5 (mm) | L6 (mm) | L7 (mm) |
|---|---|---|---|---|---|---|---|
| Example 1 | 1.3 | 1.2 | 1.4 | — | — | — | — |
| Example 2 | 1.3 | 1.0 | 1.6 | — | — | — | — |
| Example 3 | 1.3 | 1.0 | 1.6 | 1.2 | 1.1 | 1.4 | 1.5 |
| Example 4 | 1.3 | 1.0 | 1.6 | — | — | — | — |
| Example 5 | 1.3 | 1.0 | 1.6 | — | — | — | — |
| Comparative Example 1 | 1.3 | — | — | — | — | — | — |
| Comparative Example 2 | 1.3 | — | — | — | — | — | — |
| Comparative Example 3 | 1.3 | 1.25 | 1.35 | — | — | — | — |
| Comparative Example 4 | 1.3 | 0.8 | 1.8 | — | — | — | — |

TABLE 2

|  | A [GHz] | B [GHz] | C [GHz] | D [GHz] | E [GHz] | F [GHz] | G [GHz] |
|---|---|---|---|---|---|---|---|
| Example 1 | 79 | 86 | 76 | — | — | — | — |
| Example 2 | 79 | 98 | 64 | — | — | — | — |
| Example 3 | 79 | 98 | 64 | 86 | 92 | 76 | 70 |
| Example 4 | 79 | 98 | 64 | — | — | — | — |
| Example 5 | 79 | 98 | 64 | — | — | — | — |
| Comparative Example 1 | 79 | — | — | — | — | — | — |
| Comparative Example 2 | 79 | — | — | — | — | — | — |
| Comparative Example 3 | 79 | 81 | 78 | — | — | — | — |
| Comparative Example 4 | 79 | 105 | 53 | — | — | — | — |

Based on the frequencies presented in Table 2, the frequencies at which an absorption amount of an electromagnetic wave absorption pattern in each example exhibited its local maximum value were divided by A [1 GHz] to express the frequencies by a mathematical expression using A. The results are presented in Table 3.

TABLE 3

|  | A [GHz] | B [GHz] | C [GHz] | D [GHz] | E [GHz] | F [GHz] | G [GHz] |
|---|---|---|---|---|---|---|---|
| Example 1 | 79 | $1.088 \times A$ | $0.962 \times A$ | — | — | — | — |
| Example 2 | 79 | $1.240 \times A$ | $0.810 \times A$ | — | — | — | — |
| Example 3 | 79 | $1.240 \times A$ | $0.810 \times A$ | $1.088 \times A$ | $1.164 \times A$ | $0.962 \times A$ | $0.886 \times A$ |
| Example 4 | 79 | $1.240 \times A$ | $0.810 \times A$ | — | — | — | — |
| Example 5 | 79 | $1.240 \times A$ | $0.810 \times A$ | — | — | — | — |
| Comparative Example 1 | 79 | — | — | — | — | — | — |
| Comparative Example 2 | 79 | — | — | — | — | — | — |
| Comparative Example 3 | 79 | $1.025 \times A$ | $0.987 \times A$ | — | — | — | — |
| Comparative Example 4 | 79 | $1.329 \times A$ | $0.582 \times A$ | — | — | — | — |

The electromagnetic wave absorption films or the electromagnetic wave absorption sheets produced in the examples were subjected to measurement of the "frequency of peak absorption amount" that indicates the local maximum value of the absorption ratio of the entire electromagnetic wave absorption film or the electromagnetic wave absorption sheet, and the "peak value of absorption ratio" and "peak width of absorption amount" at the local maximum value in accordance with the measurement methods described above. The results are presented in Table 4.

TABLE 4

|  | Frequency of peak absorption amount [GHz] | Peak value of absorption ratio (%) | Peak width of absorption amount [GHz] |
|---|---|---|---|
| Example 1 | 78 | 38 | 14 |
| Example 2 | 79 | 69 | 19 |
| Example 3 | 76 | 65 | 20 |
| Example 4 | 82 | 99.6 | 17 |
| Example 5 | 79 | 99.9 | 14 |
| Comparative Example 1 | 79 | 27 | 5 |
| Comparative Example 2 | 78 | 99.7 | 4 |
| Comparative Example 3 | 78 | 33 | 7 |
| Comparative Example 4 | — | — | — |

In Examples 1 to 5, the frequency B [1 GHz], at which an amount of an electromagnetic wave absorbed by the second electromagnetic wave absorption pattern exhibited its local maximum value, and the frequency C [1 GHz], at which an amount of an electromagnetic wave absorbed by the third electromagnetic wave absorption pattern exhibited its local maximum value, were within the range specified in the present invention with respect to the frequency A [1 GHz], at which an amount of an electromagnetic wave absorbed by the first electromagnetic wave absorption pattern exhibited its local maximum value. In this case, as presented in Table 4, the peak width of the absorption amount at which an absorption ratio of an electromagnetic wave absorbed by the entire electromagnetic wave absorption film or electromagnetic wave absorption sheet reached its local maximum value in any one of Examples 1 to 5 was higher than in any one of Comparative Examples 1 to 3. From this result, it was confirmed that the width of a single peak at which an absorption amount of an electromagnetic wave absorbed by the entire electromagnetic wave absorption film or electromagnetic wave absorption sheet reached its local maximum value was extended to both frequency bands in the lower frequency side and the higher frequency side.

As presented in Tables 2 and 3, electromagnetic wave absorption patterns that selectively absorbed seven types of frequencies were formed on the base of the electromagnetic wave absorption film of Example 3. As presented in Table 4, in Example 3, the value of the peak width of the absorption amount was greater than that of Examples 1 and 2, and the effect of extending the width of a single peak at which an absorption amount of an electromagnetic wave absorbed by the entire electromagnetic wave absorption film or electromagnetic wave absorption sheet reached its local maximum value was significant.

The electromagnetic wave absorption sheets of Examples 4 and 5 had the electromagnetic wave absorption film of Example 2, the spacer film, and the reflective film. In this case, as presented in Table 4, the peak value of an absorption ratio of an electromagnetic wave was drastically higher compared to that in Example 2.

As presented in Table 4, the peak width of an absorption amount in Comparative Examples 1 and 2 was smaller than that in Examples 1 to 5, and no extension of the width of absorption peak could be confirmed. It is considered that the electromagnetic wave absorption film or the electromagnetic wave absorption sheet of Comparative Examples 1 and 2 was readily susceptible to a material placed in the surrounding environment and that the absorption of an electromagnetic wave of which the frequency had deviated is insufficient.

In Comparative Example 3, B [GHz] was less than the lower limit of the range specified in the present invention, and C [GHz] was greater than the upper limit of the range specified in the present invention. As such, the distance between the peak of the first electromagnetic wave absorption pattern and the peak of the second electromagnetic wave absorption pattern as well as the distance between the peak of the first electromagnetic wave absorption pattern and the peak of the third electromagnetic wave absorption pattern were both small, and no extension of the peak width could be confirmed.

In Comparative Example 4, B [GHz] was greater than the upper limit of the range specified in the present invention, and C [GHz] was less than the lower limit of the range specified in the present invention. As such, the distance between the peak of the first electromagnetic wave absorption pattern and the peak of the second electromagnetic wave absorption pattern as well as the distance between the peak of the first electromagnetic wave absorption pattern and the peak of the third electromagnetic wave absorption pattern were both large, and no single peak was formed.

FIGS. 10 to 14 are prediction charts of an absorption spectrum of electromagnetic waves inferred from the measurement results of the Examples. As illustrated in FIGS. 10 to 14, it is considered that a single peak at which an absorption amount of an electromagnetic wave absorbed by the entire electromagnetic wave absorption film or electromagnetic wave absorption sheet reached its local maximum value was formed in Examples 1 to 5.

FIGS. 15 to 18 are prediction charts of an absorption spectrum of electromagnetic waves inferred from the measurement results of each of the Comparative Examples.

Figure 15:
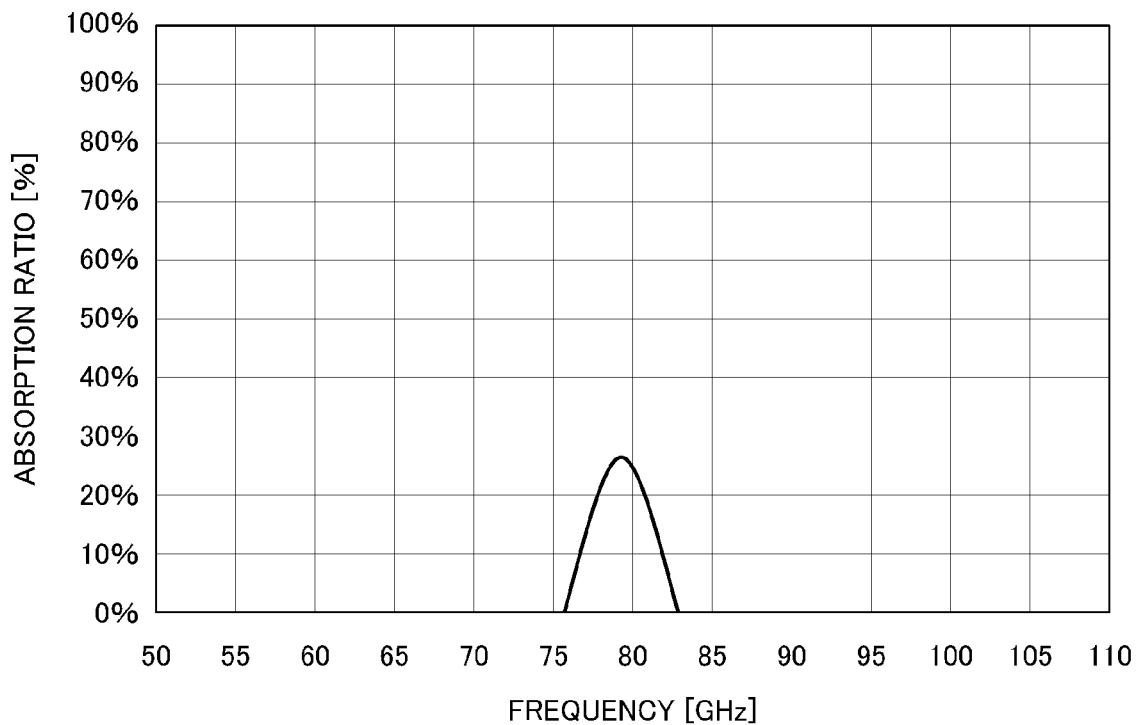
FIG. 15 is a prediction chart of an absorption spectrum of electromagnetic waves inferred from measurement results of an electromagnetic wave absorption film of Comparative Example 1.
Figure 16:
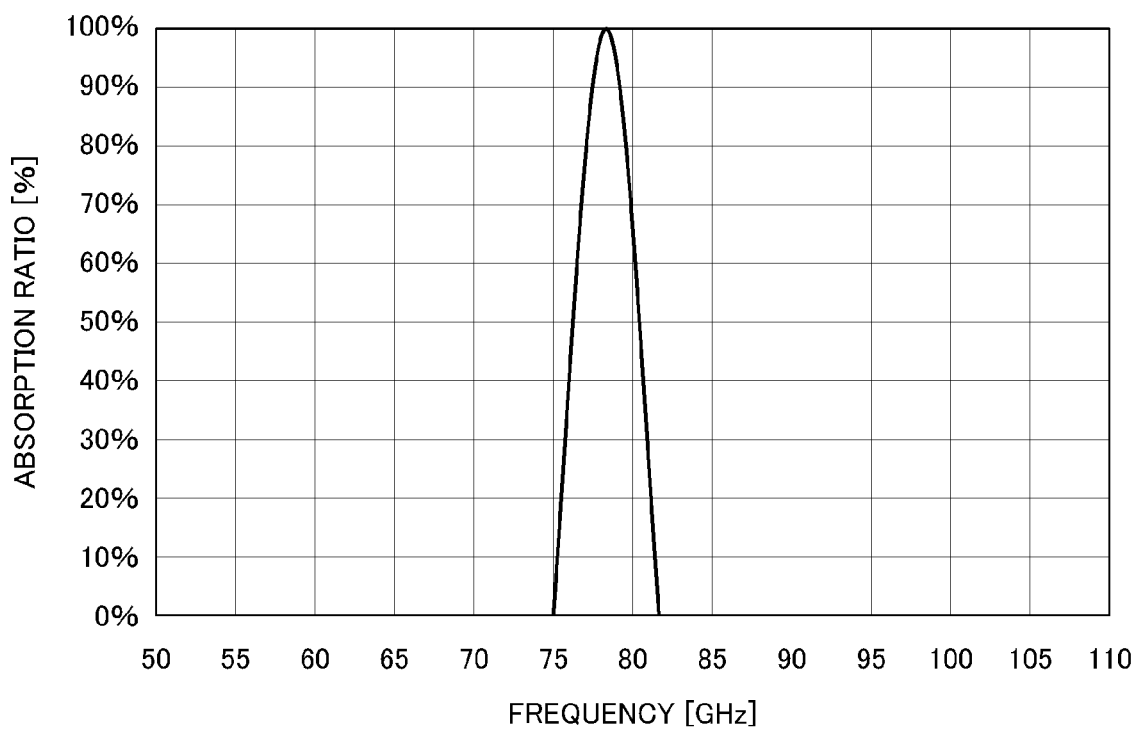
FIG. 16 is a prediction chart of an absorption spectrum of electromagnetic waves inferred from measurement results of an electromagnetic wave absorption sheet of Comparative Example 2.
Figure 17:
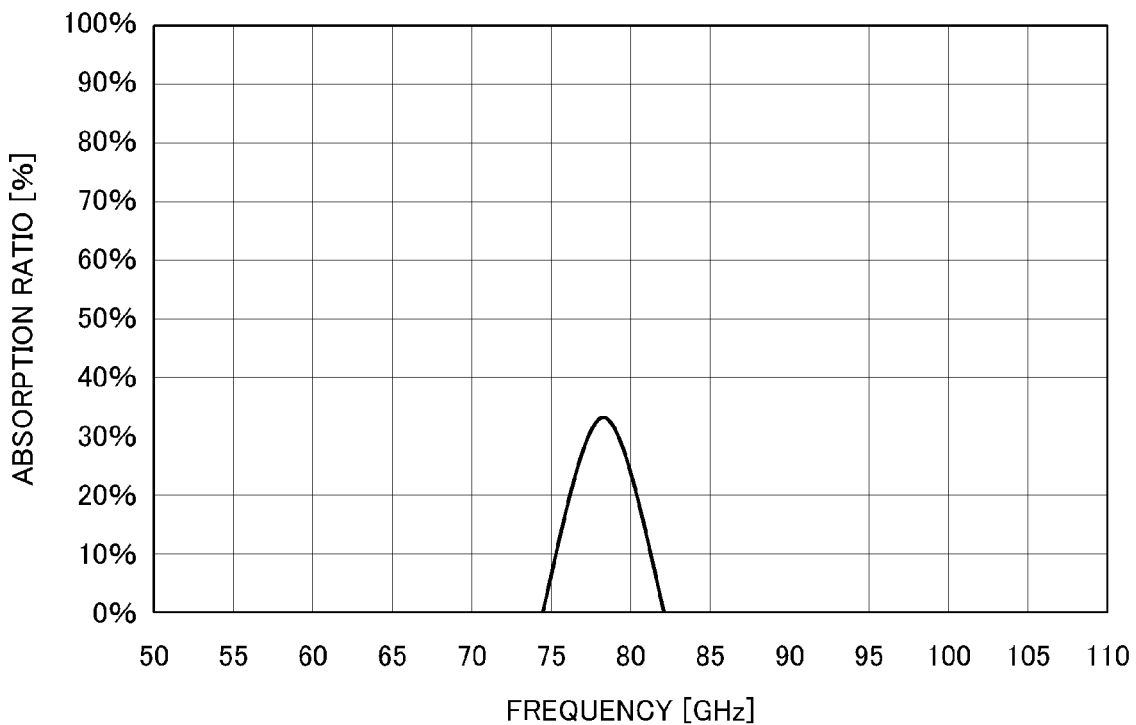
FIG. 17 is a prediction chart of an absorption spectrum of electromagnetic waves inferred from measurement results of an electromagnetic wave absorption film of Comparative Example 3.
Figure 18:
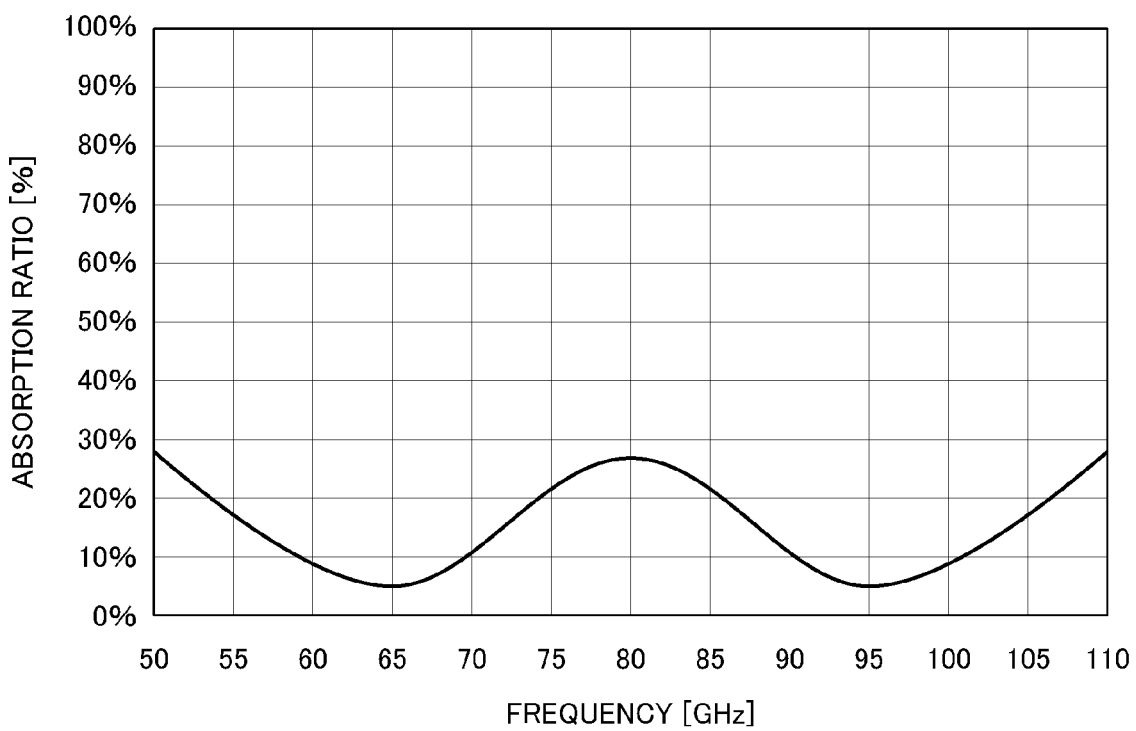
FIG. 18 is a prediction chart of an absorption spectrum of electromagnetic waves inferred from measurement results of an electromagnetic wave absorption film of Comparative Example 4.

As illustrated in FIGS. 15 to 17, the width of the single peak formed was narrow, and it is considered that no extension of the width of the peak was observed in Comparative Examples 1 to 3. As illustrated in FIG. 18, it is considered that no single peak was formed in Comparative Example 4.

From the results of the above Examples, it was confirmed that the frequency band of electromagnetic waves that can be absorbed by the electromagnetic wave absorption film or the electromagnetic wave absorption sheet increased. It can be expected that an electromagnetic wave absorption film that is less susceptible to a material placed in the surrounding environment can be provided by an embodiment of the present invention.

INDUSTRIAL APPLICABILITY

The electromagnetic wave absorption film and the electromagnetic wave absorption sheet according to an embodiment of the present invention can be used in automobile components, road-periphery members, construction outer wall-related materials, windows, communication devices, and radio telescopes.

REFERENCE SIGNS LIST

1 First electromagnetic wave absorption pattern
2 Second electromagnetic wave absorption pattern
3 Third electromagnetic wave absorption pattern
10 Electromagnetic wave absorption film
20 Base
30 Spacer film
40 Reflective film
50 Electromagnetic wave absorption sheet

The invention claimed is:

1. An electromagnetic wave absorption film comprising: a planar base; a first electromagnetic wave absorption pattern formed on the base; a second electromagnetic wave absorption pattern formed on the base; and a third electromagnetic wave absorption pattern formed on the base, wherein
when A [GHz] is defined as a frequency at which an absorption amount of an electromagnetic wave absorbed by the first electromagnetic wave absorption pattern has its local maximum value in a range from 20 to 110 GHz, B [GHz] satisfies Expression (1), B [GHz] being a frequency at which an absorption amount of an electromagnetic wave absorbed by the second electromagnetic wave absorption pattern has its local maximum value, and C [GHz] satisfies Expression (2), C [GHz] being a frequency at which an absorption amount of an electromagnetic wave absorbed by the third electromagnetic wave absorption pattern has its local maximum value, $$1.037 \times A \leq B \leq 1.30 \times A \qquad \text{Expression (1)}$$

$$0.60 \times A \leq C \leq 0.963 \times A \qquad \text{Expression (2).}$$

2. The electromagnetic wave absorption film according to claim 1, wherein A is from 50 to 110 [GHz].

3. The electromagnetic wave absorption film according to claim 1, wherein A is from 60 to 100 [GHz].

4. The electromagnetic wave absorption film according to claim 1, wherein
the first electromagnetic wave absorption pattern has a plurality of first arrangements, in which a plurality of first units whose shapes are a figure identical to each other are arranged, the second electromagnetic wave absorption pattern has a plurality of second arrangements, in which a plurality of second units whose shapes are a figure identical to each other are arranged, the third electromagnetic wave absorption pattern has a plurality of third arrangements, in which a plurality of third units whose shapes are a figure identical to each other are arranged, and the first arrangement, the second arrangement, as well as the third arrangement are disposed on the base in a manner that the first arrangement, the second arrangement, and the third arrangement are adjacent to each other.

5. An electromagnetic wave absorption sheet comprising:
the electromagnetic wave absorption film according to claim 1,
and a spacer film provided on a surface on one side of the electromagnetic wave absorption film.

6. The electromagnetic wave absorption sheet according to claim 5, wherein the spacer film is a foam sheet.

7. The electromagnetic wave absorption sheet according to claim 5, further comprising a reflective film provided on a surface of the spacer film.

* * * * *